United States Patent
Shimura

(10) Patent No.: US 7,412,679 B2
(45) Date of Patent: Aug. 12, 2008

(54) SEMICONDUCTOR INTEGRATED CIRCUIT AND SEMICONDUCTOR INTEGRATED CIRCUIT MANUFACTURING METHOD

(75) Inventor: Hidekichi Shimura, Machida (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 295 days.

(21) Appl. No.: 11/206,863

(22) Filed: Aug. 19, 2005

(65) Prior Publication Data
US 2006/0041774 A1    Feb. 23, 2006

(30) Foreign Application Priority Data
Aug. 20, 2004    (JP)    ............... 2004-241466

(51) Int. Cl.
*G06F 17/50*    (2006.01)
*H03K 19/0175*    (2006.01)

(52) U.S. Cl. ............... 716/9; 716/10; 716/13; 716/14; 326/63; 326/80; 326/81

(58) Field of Classification Search ........... 716/9, 716/10, 13, 14; 326/63, 80, 101
See application file for complete search history.

(56) References Cited

U.S. PATENT DOCUMENTS

| | | | | |
|---|---|---|---|---|
| 5,594,368 | A | * | 1/1997 | Usami ............... 326/80 |
| 5,612,892 | A | * | 3/1997 | Almulla ............... 716/6 |
| 5,761,483 | A | * | 6/1998 | Trimberger ............... 716/2 |
| 5,774,367 | A | * | 6/1998 | Reyes et al. ............... 716/2 |
| 5,818,256 | A | * | 10/1998 | Usami ............... 326/80 |
| 5,978,573 | A | * | 11/1999 | Ohara ............... 716/8 |
| 6,683,805 | B2 | | 1/2004 | Joshi et al. |
| 6,859,917 | B2 | * | 2/2005 | Shimazaki et al. ............... 716/17 |
| 7,032,200 | B1 | * | 4/2006 | Satakopan et al. ............... 716/6 |

(Continued)

FOREIGN PATENT DOCUMENTS

JP    7-007142    1/1995

(Continued)

OTHER PUBLICATIONS

Usami et al., "Automated Low-Power Technique Exploiting Multiple Supply Voltages Applied to a Media Processor", Proceedings of the IEEE 1997 Custom Integrated Circuits Conference, May 5-8, 1997, pp. 131-134.*

(Continued)

*Primary Examiner*—Phallaka Kik
(74) *Attorney, Agent, or Firm*—Greenblum & Bernstein, P.L.C.

(57) ABSTRACT

A low-power-consumption type semiconductor integrated circuit incorporating a variety of functions and a semiconductor integrated circuit manufacturing method are provided. As an example of a semiconductor integrated circuit, a system LSI 1 has first circuit blocks 41 through 48 that do not include a critical path, second circuit blocks 51 through 54 that include a critical path, first power supply wiring 25 that supplies a first power supply to first circuit blocks 41 through 48, and second power supply wiring 26 that supplies a second power supply of higher voltage than the first power supply to second circuit blocks 51 through 54, with second circuit blocks 51 through 54 being connected to second power supply wiring 26 by means of wiring areas 61 through 64 respectively, and being supplied with the second power supply.

3 Claims, 22 Drawing Sheets

U.S. PATENT DOCUMENTS

| | | | |
|---|---|---|---|
| 7,089,510 B2 * | 8/2006 | Correale et al. | 716/2 |
| 7,093,208 B2 * | 8/2006 | Williams et al. | 716/3 |
| 7,103,857 B2 * | 9/2006 | Nosowicz | 716/2 |
| 7,111,266 B2 * | 9/2006 | Correale et al. | 716/10 |
| 7,119,578 B2 * | 10/2006 | Correale et al. | 326/81 |
| 2002/0133791 A1 * | 9/2002 | Cohn et al. | 716/4 |
| 2003/0016055 A1 * | 1/2003 | Oodaira et al. | 326/81 |
| 2003/0160634 A1 * | 8/2003 | Mushiga et al. | 326/81 |
| 2004/0010726 A1 | 1/2004 | Motegi et al. | |
| 2004/0051556 A1 * | 3/2004 | Shimazaki et al. | 326/80 |
| 2004/0060023 A1 * | 3/2004 | Bednar et al. | 716/7 |
| 2004/0060024 A1 * | 3/2004 | Bednar et al. | 716/7 |
| 2004/0230924 A1 * | 11/2004 | Williams et al. | 716/2 |
| 2004/0243958 A1 * | 12/2004 | Bednar et al. | 716/7 |
| 2005/0091629 A1 * | 4/2005 | Eisenstadt et al. | 716/13 |
| 2005/0110519 A1 * | 5/2005 | Correale et al. | 326/81 |
| 2005/0114814 A1 * | 5/2005 | Correale et al. | 716/10 |
| 2005/0114815 A1 * | 5/2005 | Correale et al. | 716/10 |
| 2006/0279334 A1 * | 12/2006 | Correale et al. | 326/81 |
| 2007/0028193 A1 * | 2/2007 | Correale et al. | 716/1 |

FOREIGN PATENT DOCUMENTS

| | | |
|---|---|---|
| JP | 08-181215 | 7/1996 |
| JP | 2001-015692 | 1/2001 |

OTHER PUBLICATIONS

Kung et al., "Pushing ASIC Performing in a Power Envelop," DAC 2003, Jun. 2, 2003, pp. 788-793.

U.S. Appl. No. 11/215,998 to Enomoto et al., filed on Sep. 1, 2005.

English language Abstract of JP 2001-015692.

English language Abstract of JP 7-007142.

English language Abstract of JP 8-181215.

* cited by examiner (A)

SEMICONDUCTOR INTEGRATED CIRCUIT AND SEMICONDUCTOR INTEGRATED CIRCUIT MANUFACTURING METHOD

BACKGROUND OF THE INVENTION

1. Field of the Invention

The present invention relates to a semiconductor integrated circuit, and more particularly to system LSI (Large Scale Integration) power consumption reduction.

2. Description of the Related Art

A technology called dual threshold voltage/power supply voltage (dual Vt/Vdd) has existed for some time as a design method that lowers the power consumption of an LSI. With this technology, design is carried out as follows.

For semiconductor elements that form a critical path, the threshold voltage (Vt) is lowered and the power supply voltage (Vdd) is raised. On the other hand, for semiconductor elements that do not form a critical path, the threshold voltage (Vt) is raised and the power supply voltage (Vdd) is lowered.

By means of the above design method, the LSI operating power consumption, subthreshold leakage current, and system LSI standby subthreshold leakage current, are all reduced. A concrete example of implementation of the above effects is given in claim 2 of Patent Document 1 (Japanese Patent Publication No. 3498641), for example. Also, Non-patent Document 1 (David Kung, et al., "Pushing ASIC Performance in a Power Envelope", DAC 2003, Jun. 2, 2003) states that the technology described therein was applied to an actual LSI and had the effect of a 60 to 65% reduction in power consumption.

However, with conventional LSIs, there is a problem of not being able to provide for the incorporation into a single system LSI of functions that were divided among a plurality of LSIs. For example, with a process technology of 90 nm to 65 nm, several hundred thousand transistors (Trs) may be integrated in a single system LSI chip.

For example, a voice processing function, photographic image processing function (such as JPEG processing), and moving image processing function (such as MPEG2 processing) that were previously implemented by separate chips can now be implemented by a single system LSI.

FIG. 21 is a conceptual diagram showing an example of a system LSI chip incorporating a variety of functions in a single chip. In FIG. 21, the function blocks are assumed to be as follows, for example. Function blocks M1, M2, M3, and M4 are memory blocks such as SRAM, ROM, or DRAM. Function blocks A, B, C, D, and E are analog blocks such as A/D, D/A, and power supply circuits. Function blocks L1, L2, L3, L4, L5, L6, L7, and L8 are logic signal processing blocks such as voice processing function, photographic image processing function (for example, JPEG processing), and moving image processing function (for example, MPEG2 processing) blocks.

FIG. 22 comprises graphs showing examples of the relationship between path delay and count value for function blocks. The path delay value is shown on the horizontal axis, and the count value on the vertical axis. FIG. 22 (A) shows an example of a voice processing function block, FIG. 22 (B) an example of a photographic image processing (for example, JPEG processing) function block, and FIG. 22 (C) an example of a moving image processing (for example, MPEG2 processing) function block. As the necessary processing capability differs for a voice processing function, a photographic image processing function (for example, JPEG processing), and a moving image processing function (for example, MPEG2 processing) when path delay is shown on the horizontal axis and the count value on the vertical axis, the peak path delay values also differ as shown in FIG. 22 (A), FIG. 22 (B), and FIG. 22 (C).

Normally, the peak path delay value for each function block increases according to the function block in the order: voice processing function<photographic image processing function<moving image processing function.

Normally, assuming that a system LSI is run on a single system clock, the operating frequency at which the system LSI must operate is decided, and the necessary path delay values are decided.

In FIG. 22 (A), FIG. 22 (B), and FIG. 22 (C), the path delay value necessary for operation on a particular single clock is shown by a vertical line. A path that has a value greater than or equal to the path delay value necessary for operation on this particular single clock is a critical path. As can be seen from FIG. 22 (A), FIG. 22 (B), and FIG. 22 (C), the critical path varies somewhat for different function blocks.

Patent Document 1 and Non-patent Document 1 do not disclose a configuration, method, and so forth for attempting to reduce the operating power consumption, subthreshold leakage current, and system LSI standby subthreshold leakage current, of a system LSI that has a plurality of function blocks whose peak path delay values differ.

SUMMARY OF THE INVENTION

It is an object of the present invention to provide a semiconductor integrated circuit and semiconductor integrated circuit manufacturing method that enable a reduction in the power consumption of a semiconductor integrated circuit incorporating a variety of functions to be achieved.

According to an aspect of the invention, a semiconductor integrated circuit has a first circuit block that does not include a critical path; a second circuit block that includes the critical path; first power supply wiring that supplies a first power supply to the first circuit block; and second power supply wiring that supplies a second power supply of higher voltage than the first power supply to the second circuit block.

According to another aspect of the invention, a semiconductor integrated circuit has basic cell rows in which a plurality of circuit blocks are placed, arranged in a plurality in a first direction; a wiring placement area formed between adjacent basic cell rows in the first direction; reference power supply wiring that extends in a second direction in the wiring placement area and supplies a reference power supply to the circuit blocks; first power supply wiring that extends in the second direction in the wiring placement area and supplies a first power supply of higher voltage than the reference power supply to the circuit blocks; and second power supply wiring that extends in the second direction in the wiring placement area and supplies a second power supply of higher voltage than the first power supply to the circuit blocks.

According to still another aspect of the invention, a semiconductor integrated circuit manufacturing method has a step of placing first power supply wiring that supplies a first power supply and second power supply wiring that supplies a second power supply of higher voltage than the first power supply; a step of placing a plurality of circuit blocks; a step of connecting the plurality of circuit blocks to first power supply wiring; a step of extracting a circuit block that includes a critical path among the plurality of circuit blocks; and a step of replacing the connection of the circuit block that includes the critical path to first power supply wiring with connection of the circuit block that includes the critical path to second power supply wiring.

BRIEF DESCRIPTION OF THE DRAWINGS

The above and other objects and features of the invention will appear more fully hereinafter from a consideration of the following description taken in conjunction with the accompanying drawing wherein one example is illustrated by way of example, in which.

DESCRIPTION OF THE PREFERRED EMBODIMENTS

With reference now to the accompanying drawings, preferred embodiments of the present invention will be explained in detail below.

Embodiment 1

Figure 1:
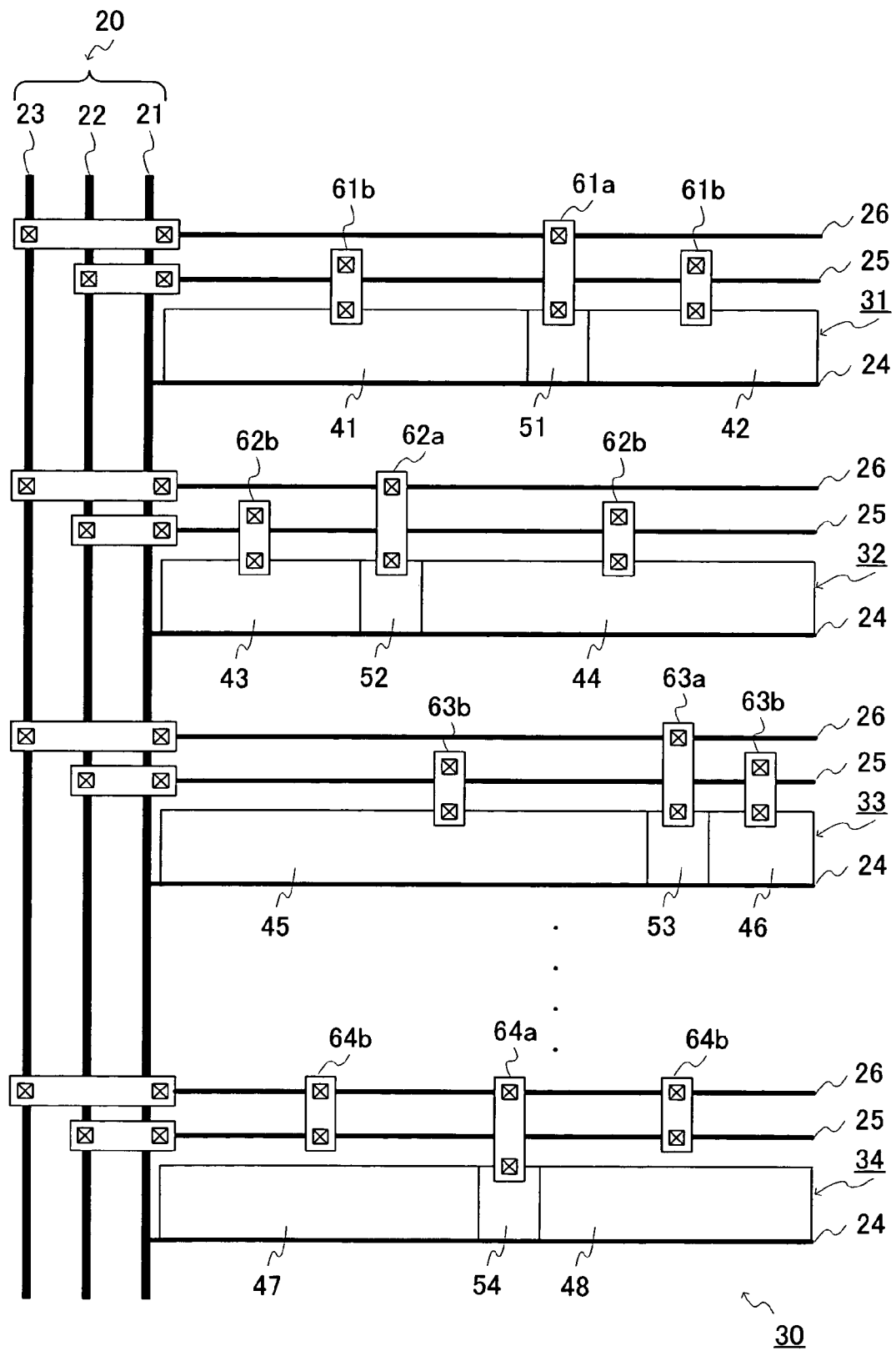
FIG. 1 is a drawing showing an example of the placement of power supply wiring and a basic cell row in a semiconductor integrated circuit according to Embodiment 1 of the present invention.

FIG. 1 is a drawing showing an example of the placement of power supply wiring and a basic cell row in a semiconductor integrated circuit according to Embodiment 1 of the present invention. The (partially illustrated) semiconductor integrated circuit shown in FIG. 1 illustrates how a plurality of power supply wirings 24 through 26 that branch from main power supply lines 20 are placed parallel to a basic cell row 30, and plurality of power supply wirings 24 through 26 are connected to circuit blocks including a critical path and circuit blocks not including a critical path among a plurality of circuit blocks included in basic cell row 30. A critical path is a path that has a value greater than or equal to the path delay value necessary for operation on a particular single clock.

FIG. 1 shows an example in which main power supply lines 20 comprise a reference main power supply line 21, a first main power supply line 22, and a second main power supply line 23. Reference main power supply line 21 supplies a reference power supply (VSS, ground VSS) with a reference power supply voltage value to circuit blocks. First main power supply line 22 supplies a first power supply (VDDL) of higher voltage than the reference power supply (a first power supply voltage value) to circuit blocks. Second main power supply line 23 supplies a second power supply (VDDH) of higher voltage than the first main power supply line (a second power supply voltage value) to circuit blocks. It is possible for a plurality of power supply voltage values to be set for VDDH, but in FIG. 1 a case in which one value is used is illustrated.

For reference main power supply line 21, first main power supply line 22, and second main power supply line 23 comprising main power supply lines 20, reference power supply wiring 24, first power supply wiring 25, and second power supply wiring 26, respectively, extend in a second direction (lateral direction) in the wiring placement area. First power supply wiring 25 and second power supply wiring 26 are connected to first main power supply line 22 and second main power supply line 23 respectively by a wiring area.

Basic cell row 30 is composed of a plurality of basic cells arrayed in a first direction (vertical direction) with respect to main power supply lines 20. FIG. 1 shows an example comprising basic cells 31, 32, 33, and 34. Basic cells 31 through 34 have a plurality of circuit blocks placed therein, and have first circuit blocks 41 through 48 that do not include a critical path, and second circuit blocks 51 through 54 that include a critical path, respectively. A wiring placement area (not shown) is formed between adjacent basic cell rows in the first direction: for example, the area between basic cell 31 and basic cell 32, and the area parallel to basic cells 31 and 32.

First circuit blocks 41 through 48 include first semiconductor elements or first logic circuits (AND, NAND, and suchlike so-called logic circuits) that do not form a critical path. On the other hand, second circuit blocks 51 through 54 include second semiconductor elements or second logic circuits that form a critical path. Second circuit blocks 51 through 54 are further provided with the aforementioned first semiconductor elements or first logic circuits. The threshold voltage value of a second semiconductor element or second logic circuit is lower than the threshold voltage value of a first semiconductor element or first logic circuit.

Wiring sections 61a through 64a are wirings that supply power from second power supply wiring 26 to basic cells 31 through 34. Wiring sections 61b through 64b are wirings that supply power from first power supply wiring 25 to basic cells 31 through 34. Which main power supply line 20 power is supplied from is decide by wiring sections 61a through 64a and 61b through 64b.

For example, in the case of basic cell 31, first circuit blocks 41 and 42 that do not include a critical path are connected to first power supply wiring 25 by means of wiring sections 61b, and second circuit block 51 that includes a critical path is connected to second power supply wiring 26 by means of wiring section 61a. Ground power supply wiring 24 is connected to all the circuit blocks. The situation is similar for the other basic cells 32 through 34. Thus, for first circuit blocks 41 and 42, a first power supply (for example, VDDL) is supplied from first power supply wiring 25, and for second circuit block 51, a second power supply (for example, VDDH) is supplied from second power supply wiring.

Figure 2:
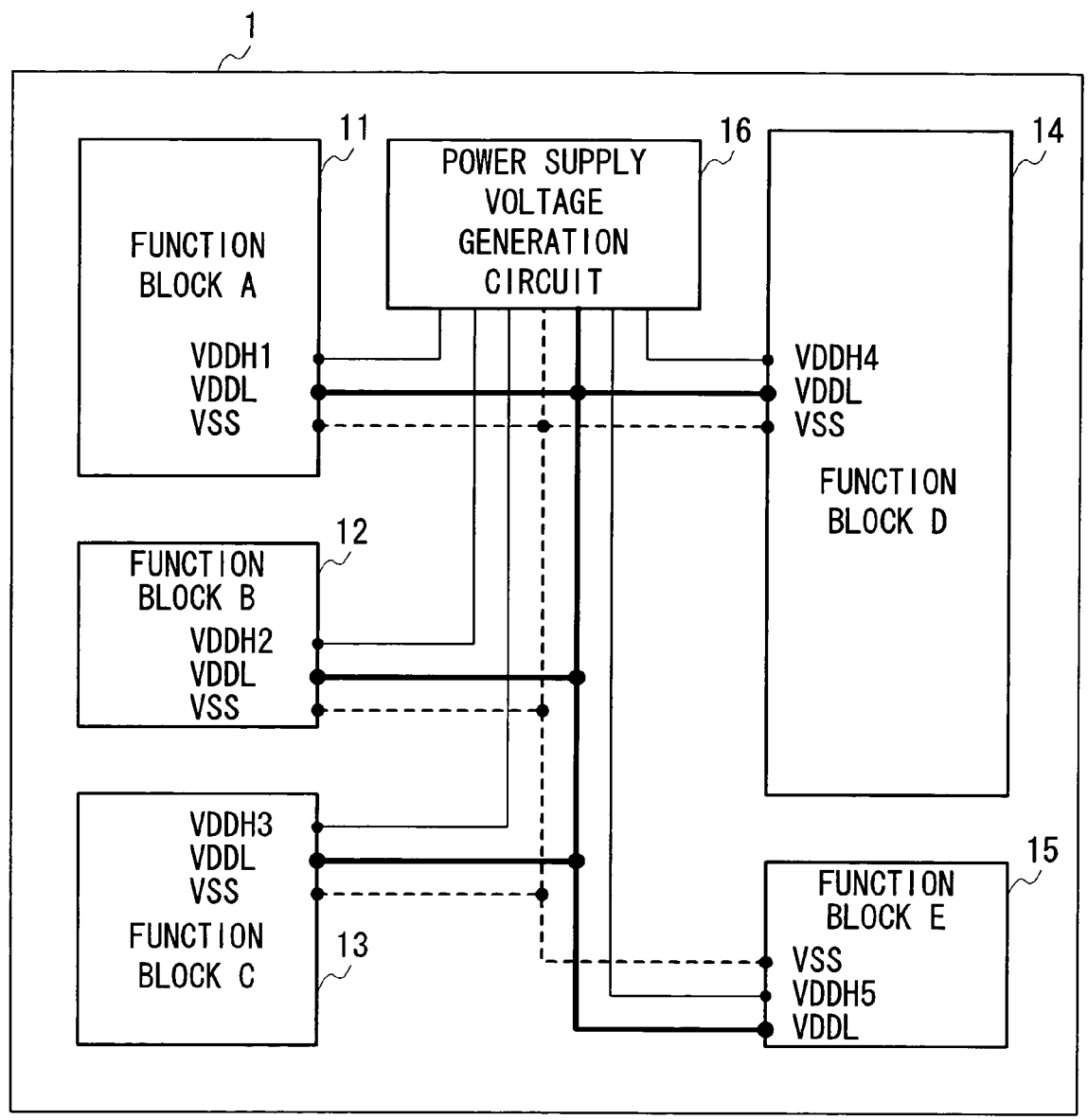
FIG. 2 is a drawing showing an example of the configuration of a large scale integrated circuit using semiconductor integrated circuitry according to the above embodiment.

An example of the application of the above semiconductor integrated circuitry will now be described. FIG. 2 is a drawing showing an example of the configuration of a large scale integrated circuit using semiconductor integrated circuitry according to this embodiment. The description will assume the use of a system LSI (Large Scale Integration) circuit as an example of a large scale integrated circuit. To simplify the description, a semiconductor integrated circuit according to this embodiment will be described using a block diagram incorporating logic signal processing blocks such as voice processing function, photographic image processing function (for example, JPEG processing), and moving image processing function (for example, MPEG2 processing) blocks. However, it goes without saying that virtually the same approach can also be adopted when memory or analog function blocks are incorporated in a semiconductor integrated circuit chip.

System LSI 1 in FIG. 2 is composed of a plurality of function blocks (function block A 11, function block B 12, function block C 13, function block D 14, and function block E 15), and a power supply voltage generation circuit 16. Power supply voltage generation circuit 16 has a plurality of power supplies that have a plurality of power supply voltage values, and supplies power to the plurality of function blocks. The plurality of power supplies have power supply voltage values suited to the processing capabilities of the plurality of function blocks, and are supplied to the respective appropriate function blocks. Each of the plurality of function blocks has one or a plurality of circuit blocks.

For power supply voltage generation circuit 16, it is assumed that one or more power supply voltage values (not shown in FIG. 2) are supplied from outside system LSI 1. System LSI 1 is made to generate power supplies that have a plurality of power supply voltage values necessary for system LSI 1 based on these supplied one or more power supply voltage values (not shown). Power supplies shown as being generated by power supply voltage generation circuit 16 in FIG. 2 are a reference power supply (VSS, also referred to as ground VSS), a first power supply (VDDL) of higher voltage than the reference power supply, and second power supplies of higher voltage than the first power supply (in FIG. 2, second power supplies with five power supply voltage values (VDDHn, where n=1 to 5); in this embodiment, the number of VDDH power supply voltage values n=5).

Power supply voltage generation circuit 16 supplies power to the function blocks as follows.

(1) Function block A 11 is supplied with power supply VDDL, power supply VDDH1, and VSS. The power supply voltage value of power supply VDDH1 is set higher than the power supply voltage value of power supply VDDL.

(2) Function block B 12 is supplied with power supply VDDL, power supply VDDH2, and VSS. The power supply voltage value of power supply VDDH2 is set higher than the power supply voltage value of power supply VDDL.

(3) Function block C 13 is supplied with power supply VDDL, power supply VDDH3, and VSS. The power supply voltage value of power supply VDDH3 is set higher than the power supply voltage value of power supply VDDL.

(4) Function block D 14 is supplied with power supply VDDL, power supply VDDH4, and VSS. The power supply voltage value of power supply VDDH4 is set higher than the power supply voltage value of power supply VDDL.

(5) Function block E 15 is supplied with power supply VDDL, power supply VDDH5, and VSS. The power supply voltage value of power supply VDDH5 is set higher than the power supply voltage value of power supply VDDL.

Thus, within the one system LSI 1, power supplies with different power supply voltage values are supplied to the function blocks, and within the function blocks, supplied power supplies appropriate to circuit block processing capability are supplied using the power supply wiring shown in FIG. 1. It is therefore possible to supply power supplies that have appropriate power supply voltage values even when processing capability varies from function block to function block.

Figure 3:
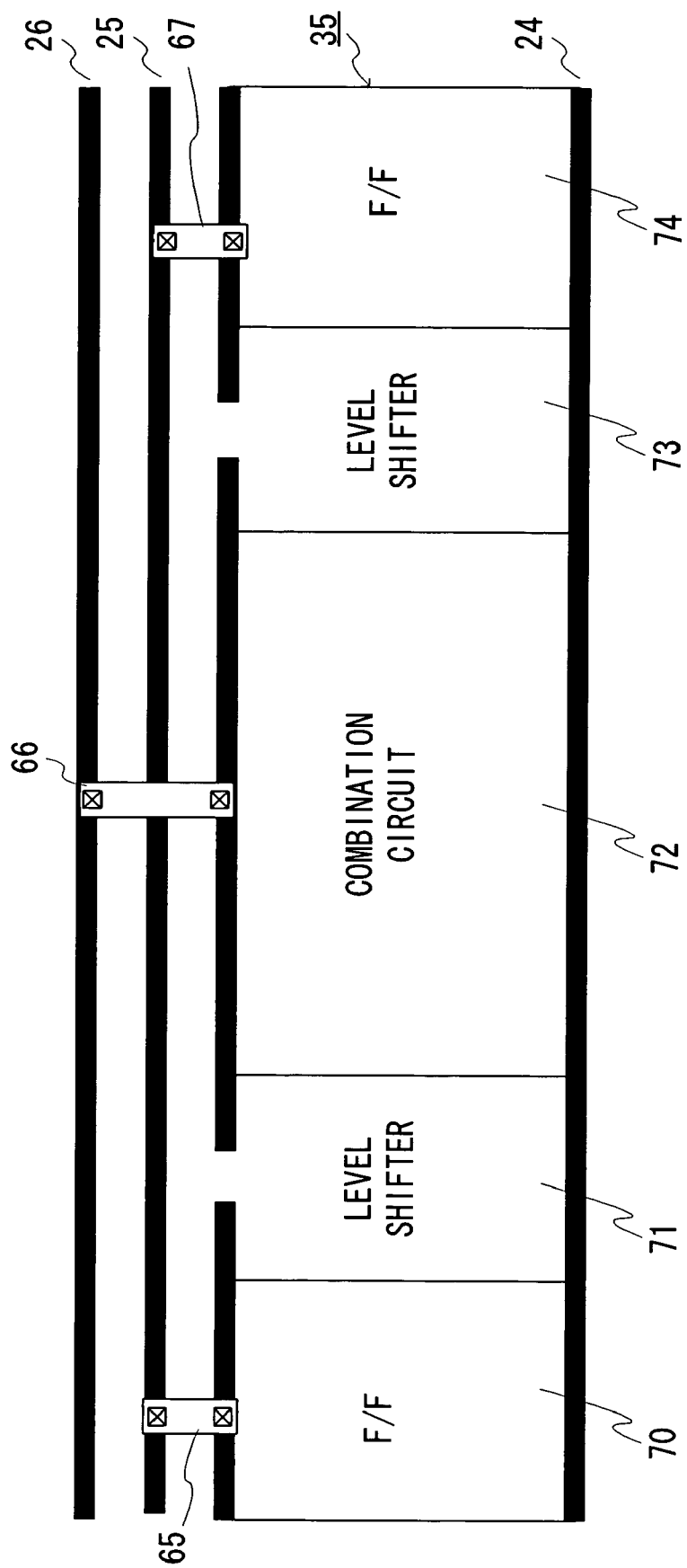
FIG. 3 is a drawing showing an example of the basic cell configuration and power supply wiring placement of a semiconductor integrated circuit according to the above embodiment.

Next, an example of the connections between the components of a basic cell and power supply wiring will be described. FIG. 3 is a drawing showing an example of the basic cell internal configuration and power supply wiring placement of a semiconductor integrated circuit according to this embodiment. Components in FIG. 3 with the same codes as in FIG. 1 have the same names and the same kind of functions as in FIG. 1, and therefore descriptions thereof are omitted. FIG. 3 shows the connection of a combination circuit 72 that includes a critical path to second power supply wiring 26.

Basic cell 35 is provided with flip-flops (F/Fs) 70 and 74, level shifters 71 and 73, and combination circuit 72. Level shifters 71 and 73 align input signal levels or output signal levels. These form circuitry comprising a critical path. Wiring area 65 is wiring that connects first power supply wiring 25, flip-flop 70, and part of level shifter 71. Wiring area 67 is wiring that connects first power supply wiring 25, flip-flop 74, and part of level shifter 73. Wiring area 66 is wiring that connects second power supply wiring 26, parts of level shifters 71 and 73, and combination circuit 72.

Figure 4:
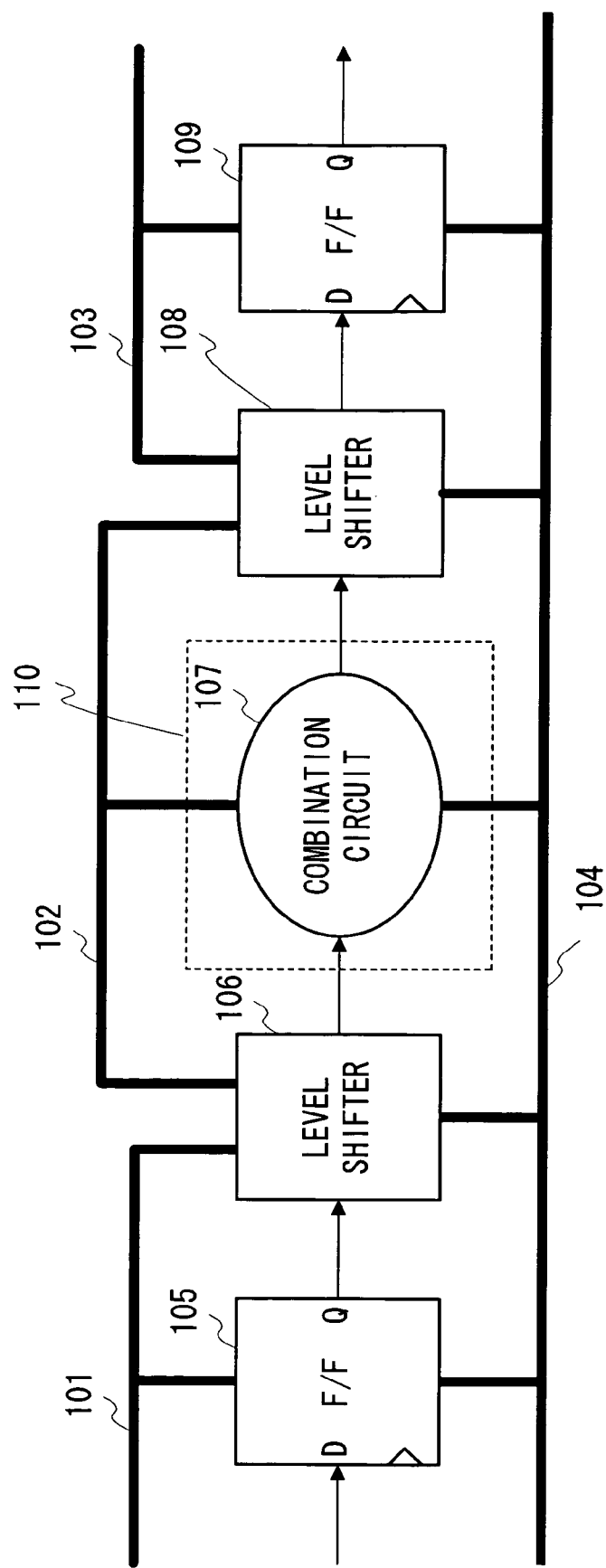
FIG. 4 is a circuit diagram showing an example of a circuit block that has a critical path in the configuration shown in FIG. 3.

FIG. 4 is a circuit diagram showing an example of a circuit block that has a critical path in the configuration shown in FIG. 3. FIG. 4 corresponds to the configuration shown in FIG. 3, and is composed of first power supply wirings 101 and 103, second power supply wiring 102, reference power supply wiring 104, flip-flops 105 and 109, level shifters 106 and 108, and a combination circuit 107. Area 110 enclosed by a dotted line denotes an area in which the threshold voltage of component semiconductor elements is lower than the threshold voltage of semiconductor elements comprising a circuit block that does not form a critical path. Flip-flops 105 and 109 are semiconductor elements that do not form a critical path (first semiconductor elements). Signal flow is indicated by the arrows (→).

By using the kind of circuit configuration shown in FIG. 1 through FIG. 4, design is performed so that the threshold voltage (Vt) is lowered and the power supply voltage (Vdd) is raised for semiconductor elements forming a critical path, and the threshold voltage (Vt) is raised and the power supply voltage (Vdd) is lowered for semiconductor elements that do not form a critical path. In this way, the concept of a dual vt/vdd technology is realized.

Thus, a first circuit block that does not form a critical path is connected to first power supply wiring and is supplied with a first power supply (VDD), while a second circuit block forming a critical path is connected to second power supply wiring and is supplied with a second power supply (VDDH or VDDHn). As for the second power supply, one or more power supplies VDDHn (in this embodiment, having a value from n=1 to 5) having power supply voltage values suited to the respective processing capabilities of a plurality of circuit blocks (function blocks) are supplied to the plurality of circuit blocks from a plurality of power supplies with different power supply voltage values generated by a power supply voltage generation circuit. Also, a feature of this power supply voltage value is that it is higher than the power supply voltage value of the same power supply supplied to a circuit block that does not form a critical path. Therefore, with a semiconductor integrated circuit according to this embodiment, power supplies VDDHn are supplied that have power supply voltage values suited to the processing capabilities of a plurality of circuit blocks that include a critical path, thereby enabling lower power consumption to be achieved.

In this embodiment, a case has been described in which power supplies having power supply voltage values suited to the respective processing capabilities of a plurality of circuit blocks (function blocks) are supplied from a plurality of power supplies generated by a power supply voltage generation circuit, with one power supply being supplied to each of the plurality of circuit blocks. However, supply of power to circuit blocks is not limited to supply from a power supply voltage generation circuit as shown in FIG. 2, and power supplies having power supply voltage values suited to the respective processing capabilities of a plurality of circuit blocks (function blocks) may also be supplied from a plurality of power supplies from outside system LSI 1. Also, one or more power supplies may be supplied to each of a plurality of function blocks: for example, power may be supplied to one circuit block from a plurality of power supplies. Here, a description of a case in which a plurality of power supplies are supplied from outside is omitted, but details are basically similar to the case where power supplies are generated by a power supply voltage generation circuit.

Embodiment 2

In Embodiment 1, a case was described in which power supplies having power supply voltage values suited to the respective processing capabilities of a plurality of circuit blocks (function blocks) are supplied from a plurality of power supplies generated by a power supply voltage generation circuit, with one power supply being supplied to each of the plurality of circuit blocks. In Embodiment 2, a case will be described in which power supplies having power supply voltage values suited to the respective processing capabilities of a plurality of circuit blocks (function blocks) are supplied from a plurality of power supplies generated by a power supply voltage generation circuit, with one or more power supplies (in particular, a plurality of power supplies) being supplied to each of the plurality of circuit blocks.

Figure 5:
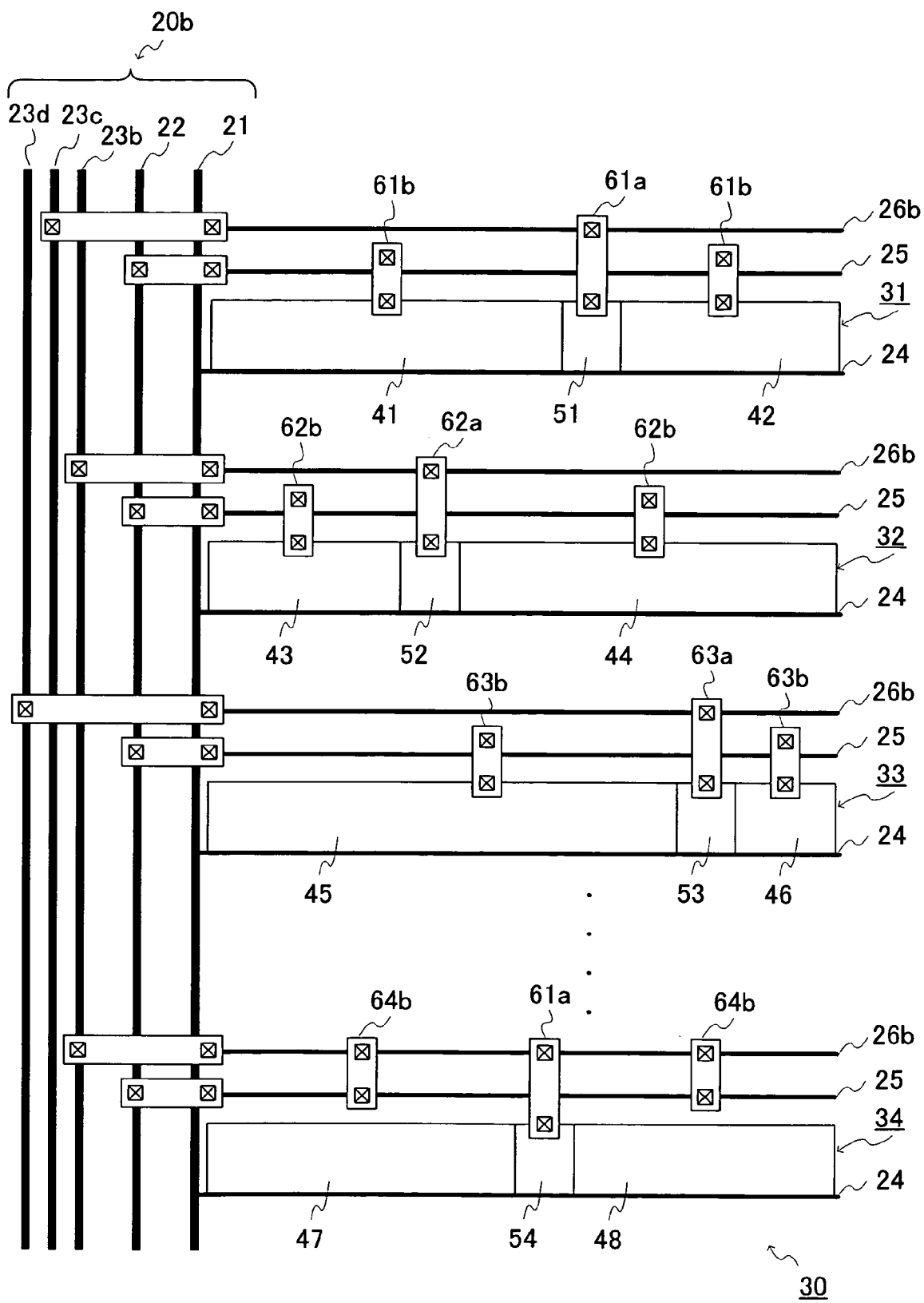
FIG. 5 is a drawing showing an example of the placement of power supply wiring and a basic cell row in a semiconductor integrated circuit according to Embodiment 2 of the present invention.

FIG. 5 is a drawing showing an example of the placement of power supply wiring and a basic cell row in the principal parts of a semiconductor integrated circuit according to Embodiment 2 of the present invention. Components in FIG. 5 with the same codes as in FIG. 1 have the same names and the same kind of functions as in FIG. 1, and therefore descriptions thereof are omitted. In FIG. 5, a plurality of power supply wirings 24, 25, and 26b branching from main power supply lines 20b are placed parallel to basic cell row 30, and plurality of power supply wirings 24, 25, and 26b are connected to circuit blocks including a critical path and circuit blocks not including a critical path among the plurality of circuit blocks included in basic cell row 30.

FIG. 5 shows an example in which main power supply lines 20b comprise a reference main power supply line 21, a first main power supply line 22, and a plurality of second main power supply lines 23b, 23c, and 23d. The second main power supply lines supply a plurality of second power supplies with higher voltages than the first main power supply line (second power supply voltage values) to circuit blocks. In FIG. 5 a case is shown in which, with regard to VDDH, second power supplies comprising a plurality of power supply voltage values are supplied from second main power supply lines 23b, 23c, and 23d.

Second power supply wiring 26b extends in a second direction (lateral direction), and is connected to one of second main power supply lines 23b, 23c, or 23d. The power supply voltage supplied to a second circuit block varies according to which of second main power supply lines 23b, 23c, or 23d second power supply wiring 26b is connected to. In this way, a second power supply that has a power supply voltage value appropriate to the processing capability of a second circuit block can be supplied to that second circuit block. A designer can select a power supply voltage value appropriate to the processing capability of a second circuit block that includes a critical path.

Figure 6:
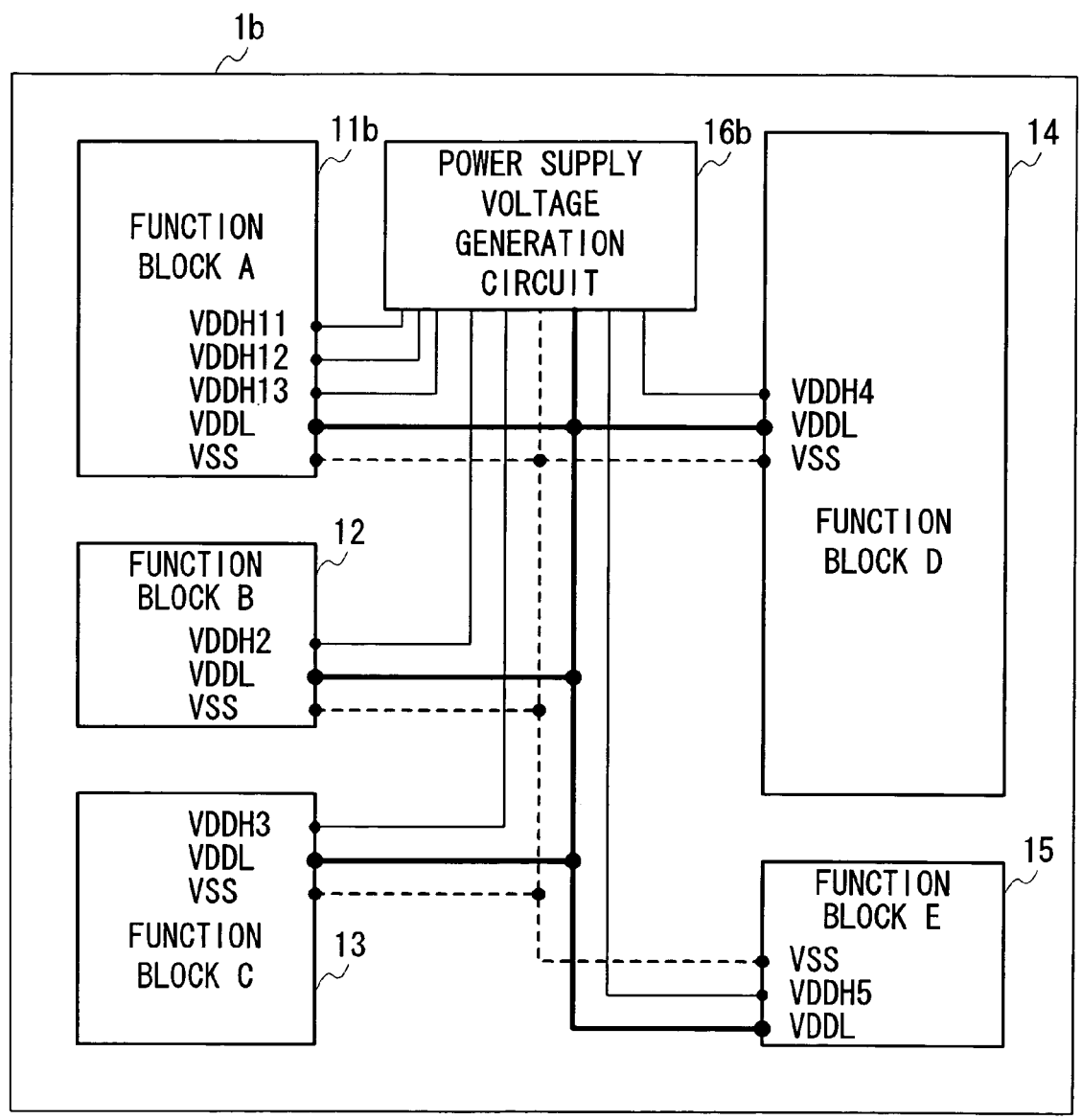
FIG. 6 is a drawing showing an example of the configuration of a large scale integrated circuit using semiconductor integrated circuitry according to the above embodiment.

An example of the application of the above semiconductor integrated circuitry will now be described. FIG. 6 is a drawing showing an example of the configuration of a large scale integrated circuit using semiconductor integrated circuitry according to this embodiment. Components in FIG. 6 with the same codes as in FIG. 2 have the same names and the same kind of functions as in FIG. 2, and therefore descriptions thereof are omitted. FIG. 6 shows a case in which power supplies having power supply voltage values suited to the respective processing capabilities of a plurality of function blocks are supplied from a plurality of power supplies generated by a power supply voltage generation circuit 16b, with one or more power supplies being supplied to each of the plurality of function blocks.

For power supply voltage generation circuit 16b, it is assumed that one or more power supply voltage values (not shown in FIG. 6) are supplied from outside system LSI 1b. System LSI 1b is made to generate power supplies that have a plurality of power supply voltage values necessary for system LSI 1b based on these supplied one or more power supply voltage values (not shown). Power supplies shown as being generated by power supply voltage generation circuit 16b in FIG. 6 are a reference power supply, a first power supply (VDDL) of higher voltage than the reference power supply, and second power supplies of higher voltage than the first power supply (in FIG. 6, seven second power supplies with seven power supply voltage values (VDDHn, where n=2 to 5, 11, 12, or 13)) It goes without saying that the number of generated second power supply voltage values is not limited to seven, and it is possible to generate power supplies as appropriate to system LSI 1b.

To simplify the explanation, a case will be described here, by way of example, in which three second power supplies (power supply VDDH11, power supply VDDH12, and power supply VDDH13) are supplied to function block A 11b.

Power supply voltage generation circuit 16b supplies power to the function blocks as follows. Function block A 11b is supplied with power supply VDDL, power supply VDDH11, power supply VDDH12, and power supply VDDH13, and VSS. The power supply voltage values of power supply VDDH11, power supply VDDH12, and power supply VDDH13 are set higher than the power supply voltage value of power supply VDDL. Also, the power supply voltage values of power supply VDDH11, power supply VDDH12, and power supply VDDH13 are different. The power supply situation for function block B 12, function block C 13, function block D 14, and function block E 15 is as shown in FIG. 2, and therefore a description thereof will be omitted here.

By using the kind of circuit configuration shown in FIGS. 6 and 5 and FIGS. 3 and 4, design is performed so that the threshold voltage (Vt) is lowered and the power supply voltage (Vdd) is raised for semiconductor elements forming a critical path, and the threshold voltage (Vt) is raised and the power supply voltage (Vdd) is lowered for semiconductor elements that do not form a critical path. In this way, the concept of a dual vt/vdd technology is realized.

Thus, with a semiconductor integrated circuit according to this embodiment, in addition to the functions described in Embodiment 1, power supplies of a plurality of power supply voltage values are supplied to one function block. Therefore, power supplies suited to the processing capabilities of a plurality of circuit blocks that include a critical path can be supplied more precisely, thereby enabling lower power consumption to be achieved.

Embodiment 3

In Embodiment 3, a method of further improving subthreshold leakage current will be described. By developing the concept of a dual vt/vdd technology, it becomes possible to reduce the operating power consumption, subthreshold leakage current, and semiconductor integrated circuit standby subthreshold leakage current while maintaining the performance of a semiconductor integrated circuit that has a variety of function blocks. As details of the dual vt/vdd technology concept are described in Embodiment 1, they will be omitted here.

A method of further improving the standby subthreshold leakage current will now be described. In the following description, the circuit diagram of a circuit block that has a critical path shown in FIG. 4 is used by way of example.

Figure 7:
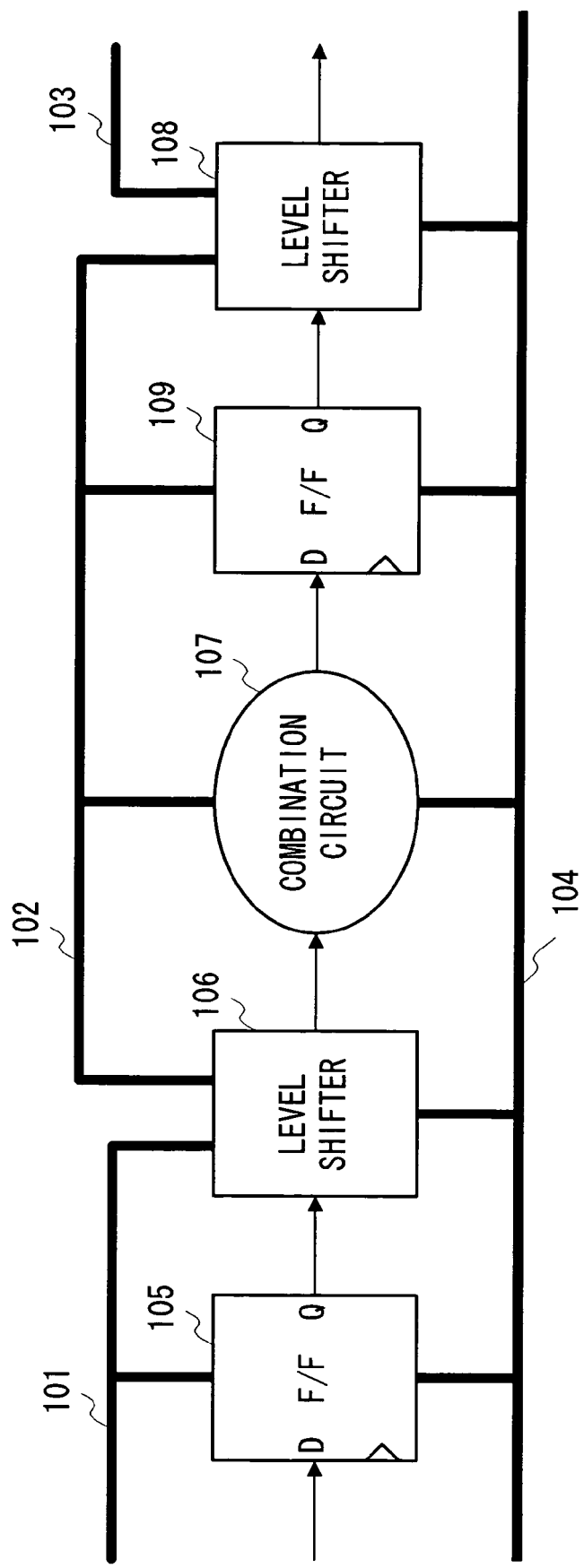
FIG. 7 is a circuit diagram showing an example of placement (positional relationship) modification of the circuit block shown in FIG. 4.
Figure 8:
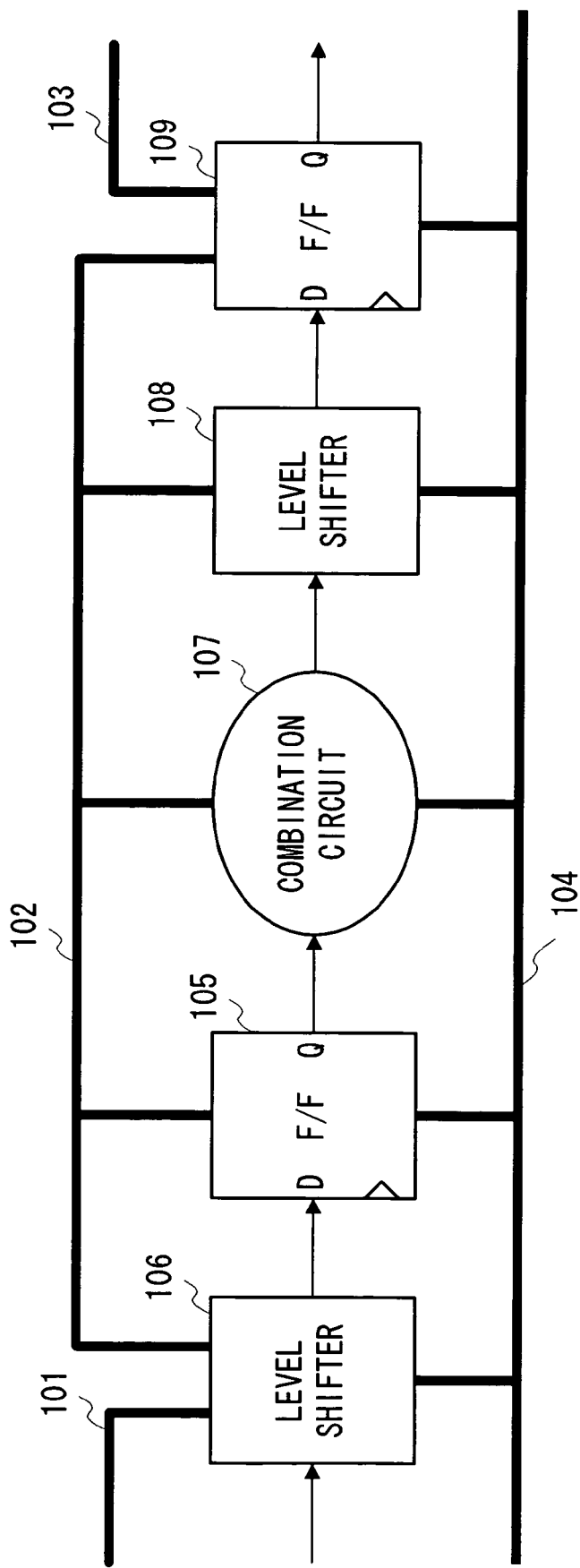
FIG. 8 is a circuit diagram showing another example of placement (positional relationship) modification of the circuit block shown in FIG. 4.
Figure 9:
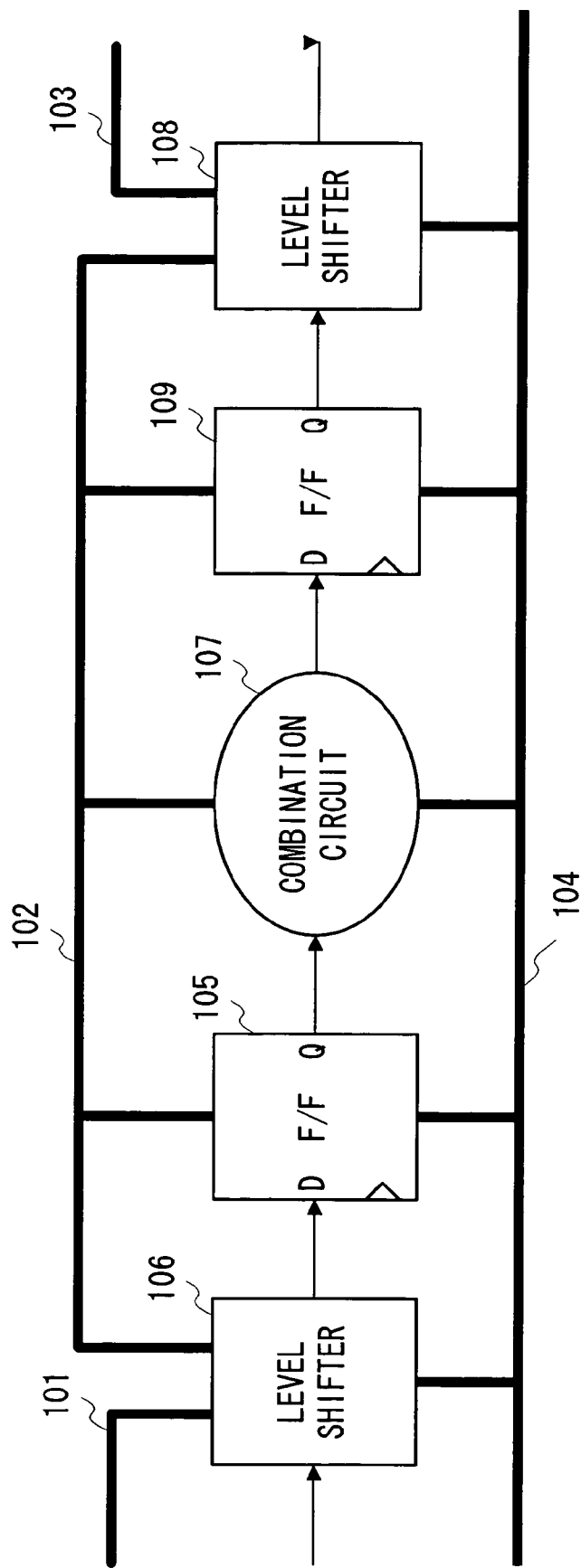
FIG. 9 is a circuit diagram showing still another example of placement (positional relationship) modification of the circuit block shown in FIG. 4.

First, the positional relationships of the two flip-flops 105 and 109, the two level shifters 106 and 108, and combination circuit 107 will be considered. FIG. 7 through FIG. 9 are circuit diagrams showing examples of modification of placement (positional relationships) of the circuit block shown in FIG. 4. Components in FIG. 7 through FIG. 9 have the same names and the same kind of functions as in FIG. 4, although their positional and connectional relationships differ, and therefore descriptions thereof are omitted. FIG. 4 and FIG. 7 through FIG. 9 illustrate four possible positional relationships of the two flip-flops 105 and 109, the two level shifters 106 and 108, and combination circuit 107.

Next, semiconductor element threshold voltage values will be considered. As an example, the positional relationship of the two flip-flops 105 and 109, the two level shifters 106 and 108, and combination circuit 107 shown in FIG. 4 will be considered. FIG. 10 through FIG. 14 are drawings showing examples of an area in which the semiconductor element threshold voltage is lowered in the circuit block shown in FIG. 4. Five cases can be considered as shown in FIG. 10, FIG. 11, FIG. 12, FIG. 13, and FIG. 14 according to which area is taken as an area in which the semiconductor element threshold voltage is lowered. The areas enclosed by dotted lines 111, 112, 113, 114, and 115 are areas in which the semiconductor element threshold voltage is lowered. There are thus a total of 20 possible cases according to the positional relationship of the two flip-flops 105 and 109, the two level shifters 106 and 108, and combination circuit 107, and which area is taken as an area in which the semiconductor element threshold voltage is lowered.

With regard to the above-described positional relationships and threshold voltages, as long as timing conditions are satisfied there is no inevitability as to which must be taken from among the total of 20. However, when a power supply voltage (second power supply, VDDH) is not being supplied to second power supply wiring 102, if the standby subthreshold leakage current is to be improved by applying a power supply voltage to the combination circuit, configurations that meet the aforementioned conditions are limited. When a power supply voltage is not being supplied to second power supply wiring 102, it is desirable to maintain the immediately preceding state for the two flip-flops 105 and 109. Therefore, circuit block positional relationships whereby a power supply voltage ceases to be applied to the two flip-flops 105 and 109 when a power supply voltage is not being supplied to second power supply wiring 102—that is, FIG. 7, FIG. 8, and FIG. 9—are excluded.

In FIG. 10 through FIG. 14, FIG. 12 and FIG. 14 are also excluded since they do not meet the objective of further improving the standby subthreshold leakage current if the threshold voltage of the two flip-flops 105 and 109 to which a second power supply (VDDH) is being supplied is lowered.

Figure 10:
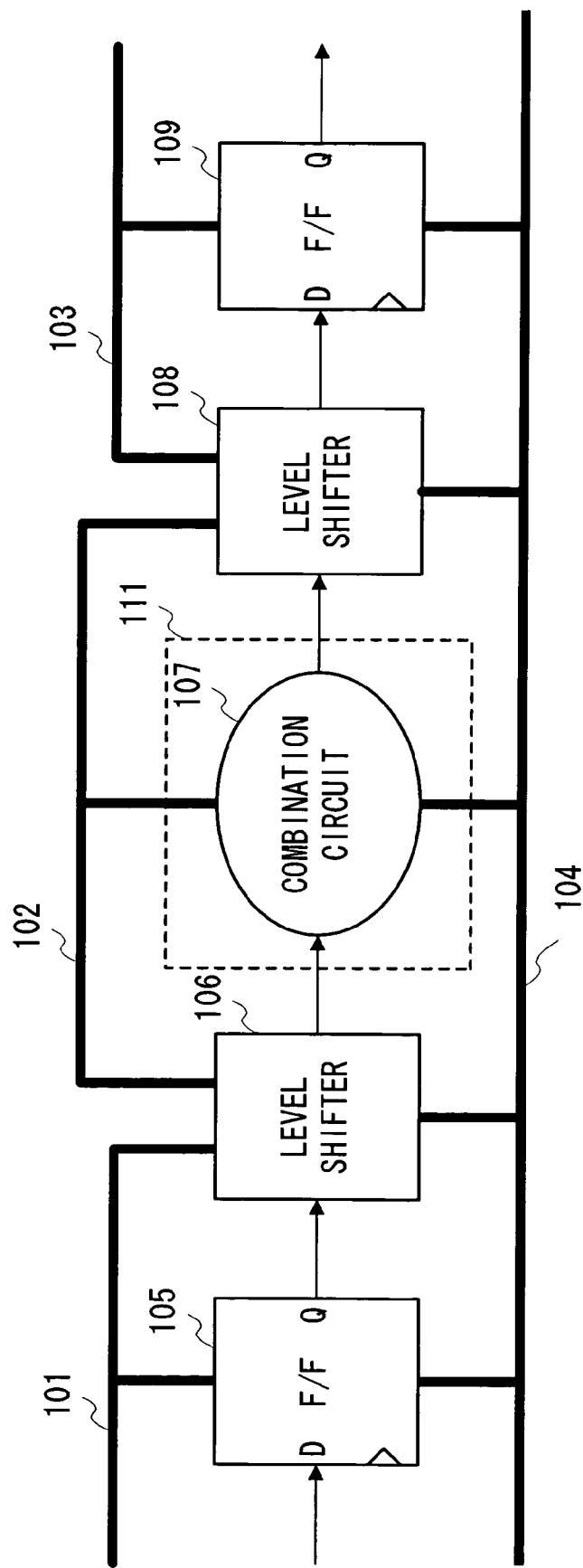
FIG. 10 is a drawing showing an example of an area in which the semiconductor element threshold voltage is lowered in the circuit block shown in FIG. 4.
Figure 11:
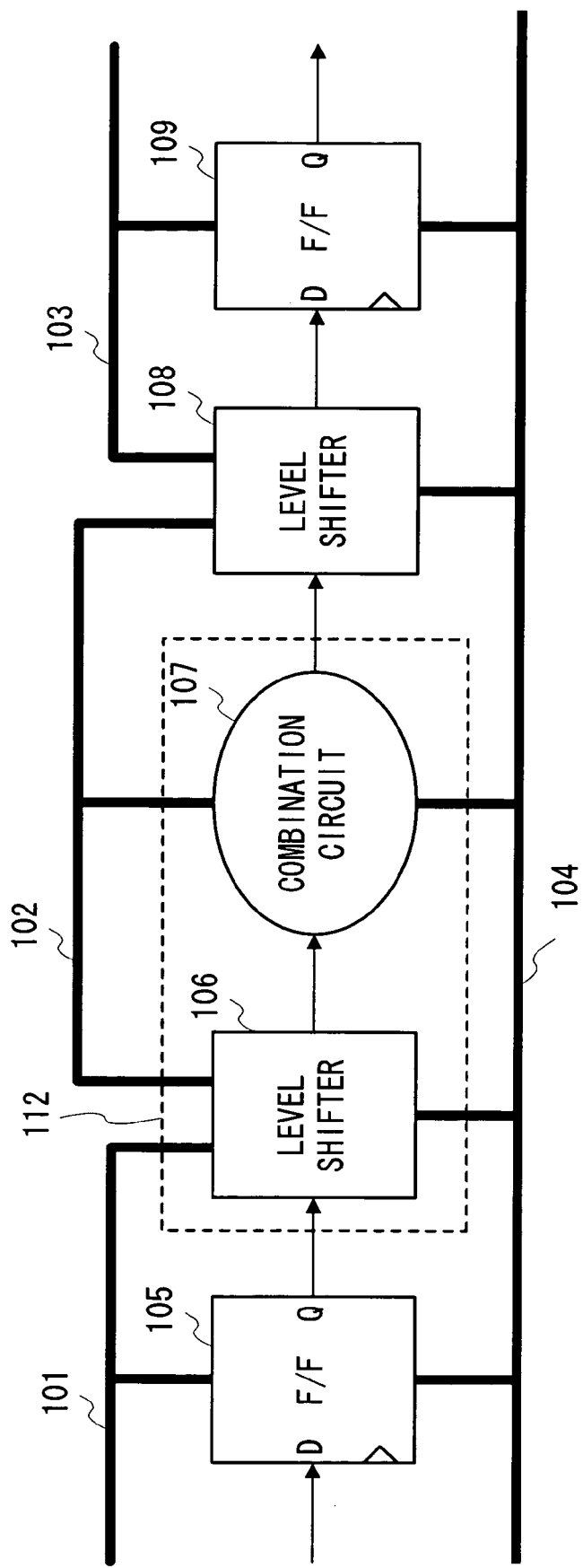
FIG. 11 is a drawing showing another example of an area in which the semiconductor element threshold voltage is lowered in the circuit block shown in FIG. 4.
Figure 12:
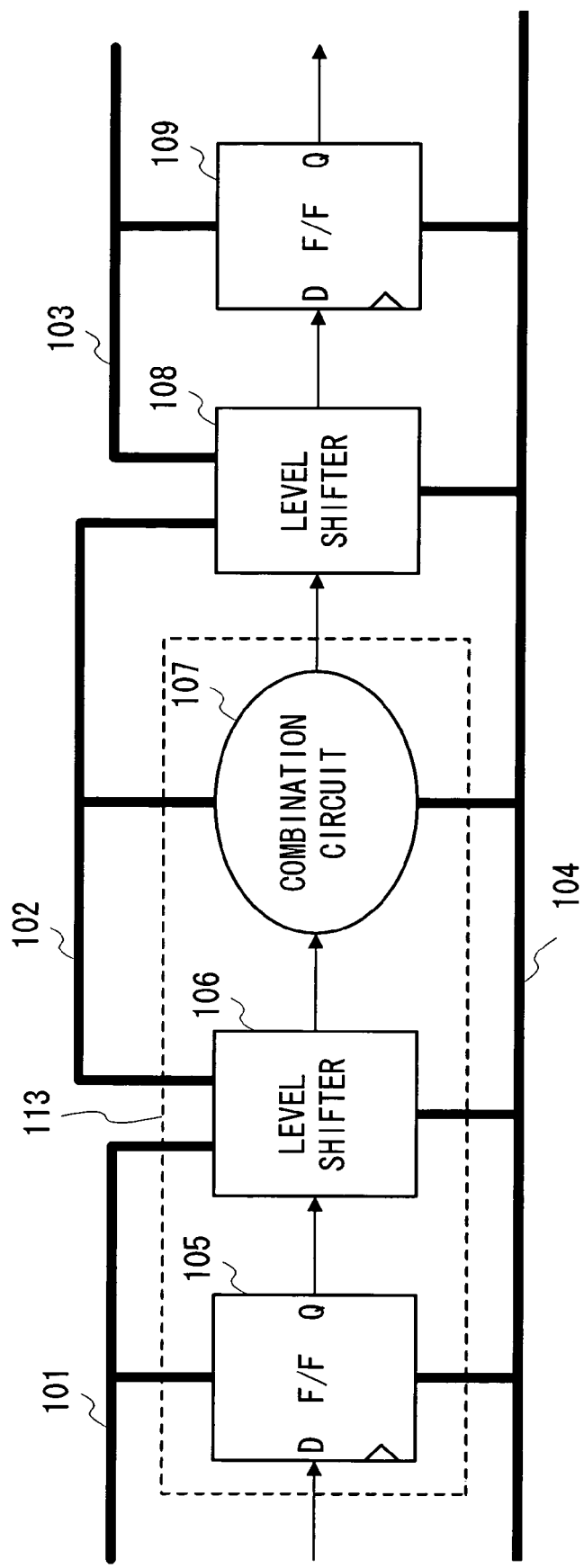
FIG. 12 is a drawing showing still another example of an area in which the semiconductor element threshold voltage is lowered in the circuit block shown in FIG. 4.
Figure 13:
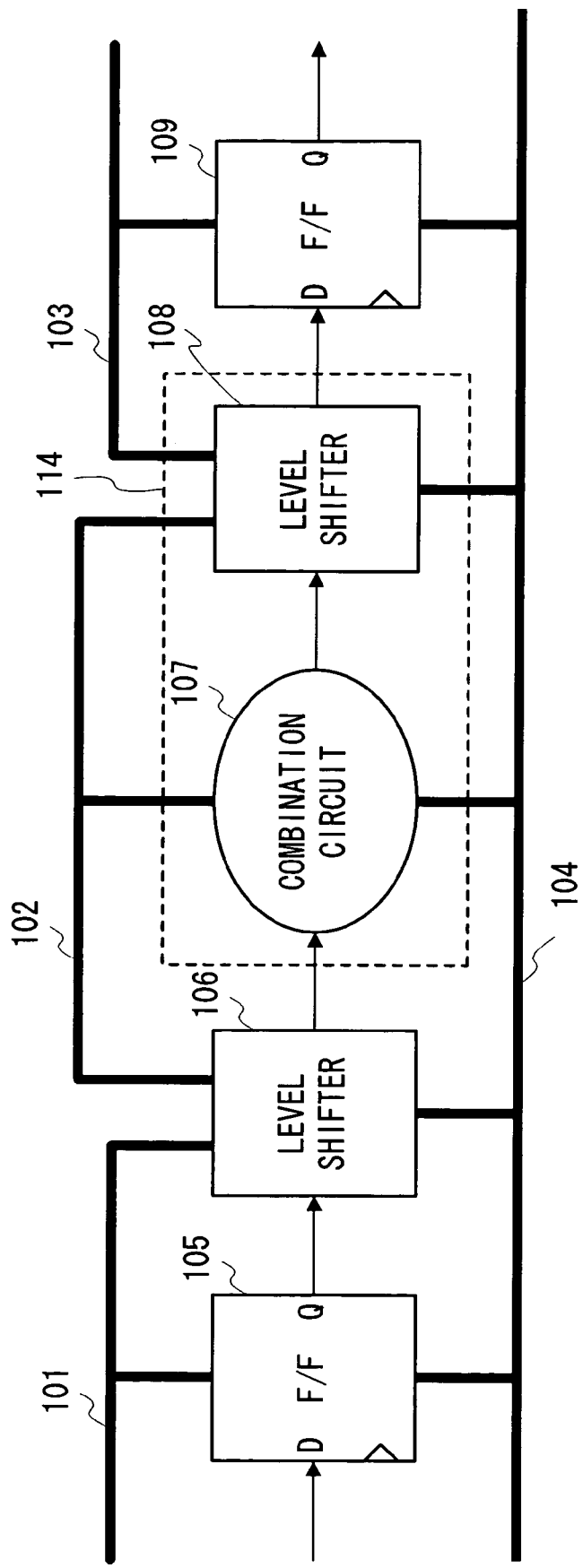
FIG. 13 is a drawing showing still another example of an area in which the semiconductor element threshold voltage is lowered in the circuit block shown in FIG. 4.
Figure 14:
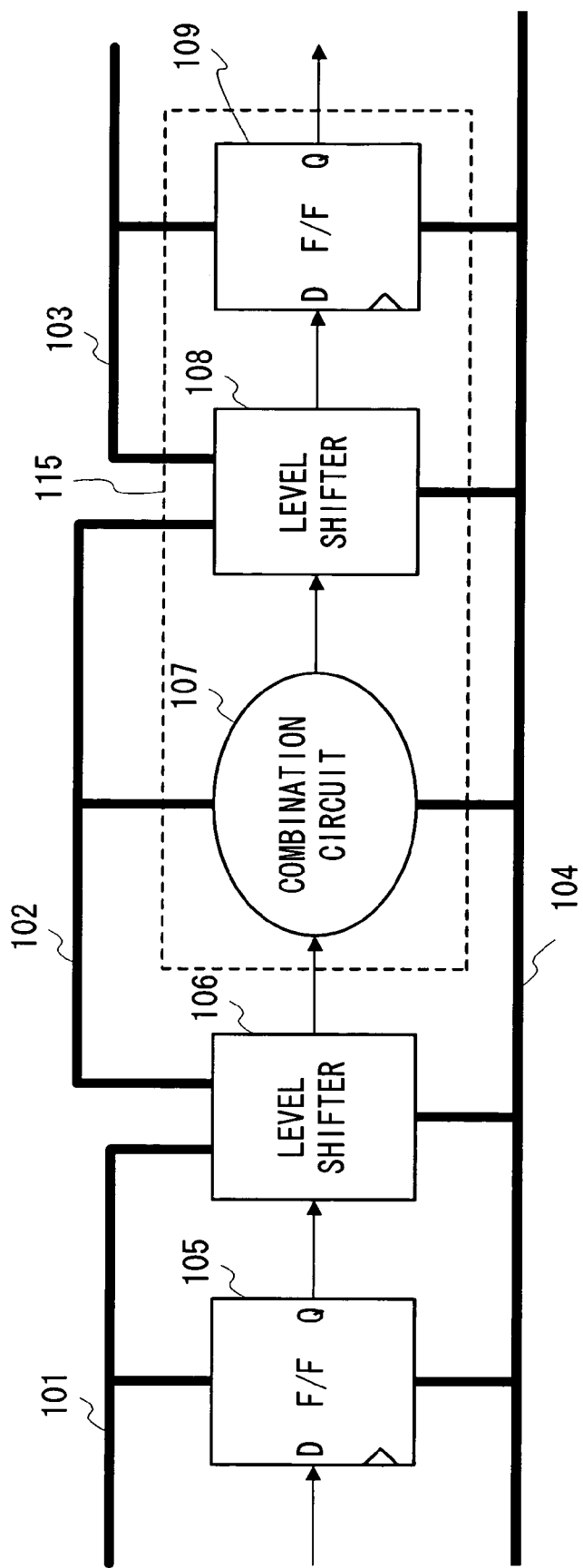
FIG. 14 is a drawing showing still another example of an area in which the semiconductor element threshold voltage is lowered in the circuit block shown in FIG. 4.

Therefore, configurations in terms of the positional relationship of the two flip-flops 105 and 109, the two level shifters 106 and 108, and combination circuit 107, and which area is to be made an area for which the semiconductor element threshold voltage is lowered, when attempting to further improve the standby subthreshold leakage current by not applying a power supply voltage to combination circuit 107 when a power supply voltage is not being applied to second power supply wiring 102, are limited to those in FIG. 10, FIG. 11, and FIG. 13. Of these, FIG. 10 is the most preferable from the standpoint of reducing the standby subthreshold leakage current and maintaining the immediately preceding state for the two flip-flops 105 and 109 when a power supply voltage is not being supplied to second power supply wiring 102.

Thus far, in order to simplify the explanation of the positional relationship of the two flip-flops 105 and 109, the two level shifters 106 and 108, and combination circuit 107, cases have been described in which level shifter 108 is located after combination circuit 107, but since level shifter 108 is not necessarily normally needed, it may be omitted.

Figure 15:
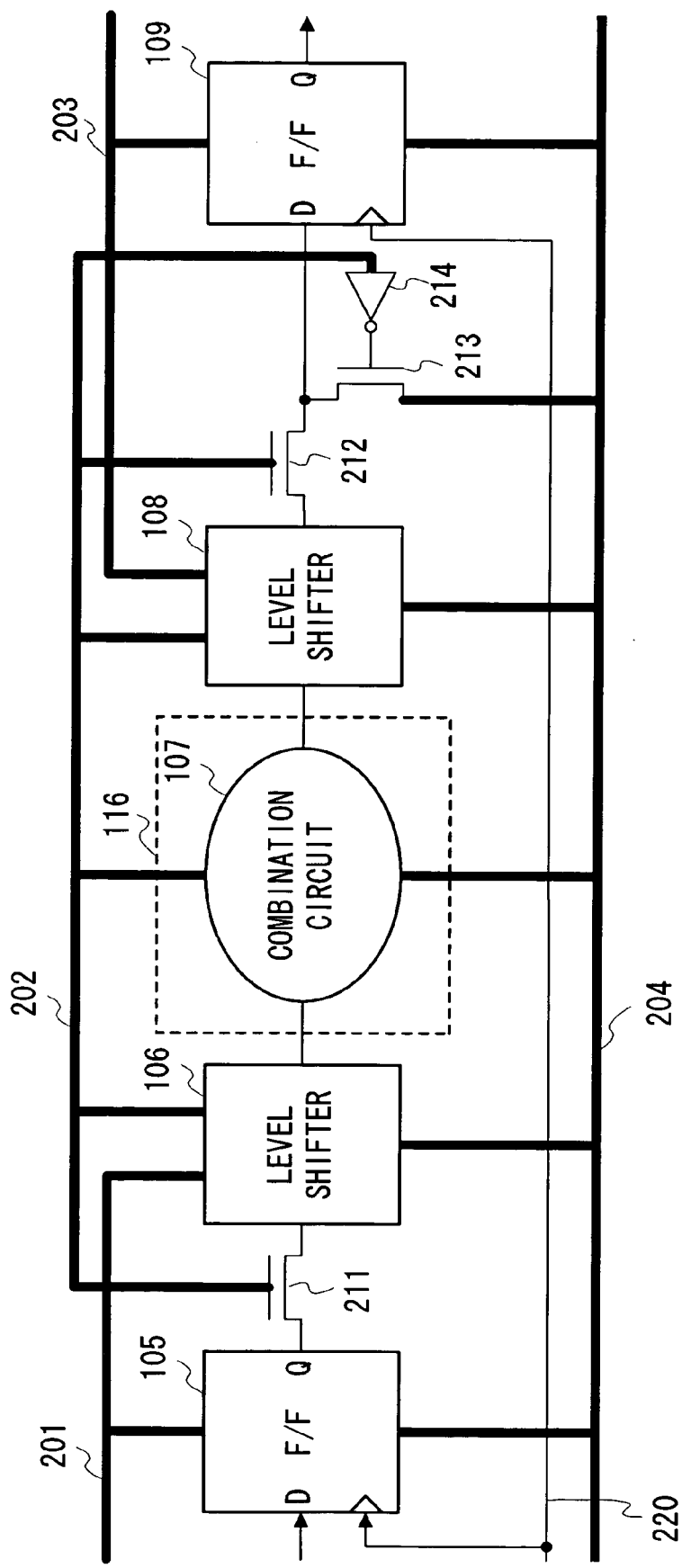
FIG. 15 is a circuit diagram whereby the subthreshold leakage current in the circuit block configuration shown in FIG. 4 is improved.

FIG. 15 is an example of a circuit diagram whereby the subthreshold leakage current in the circuit block configuration shown in FIG. 4 is improved. FIG. 15 shows an actual circuit diagram for improving the standby subthreshold leakage current by not applying a power supply voltage to the combination circuit when a power supply voltage is not being applied to the second power supply wiring.

In FIG. 15, first power supply wirings 201 and 203, second power supply wiring 202, and reference power supply wiring 204 are similar to items with the same names in FIG. 1, and therefore descriptions thereof are omitted. The area denoted by code 116 enclosed by a dotted line is an area in which the threshold voltage of component semiconductor elements is lower than the threshold voltage of semiconductor elements comprising a circuit block that that does not form a critical path. The circuit diagram shown in FIG. 15 includes transfer gates 211, 212, and 213, an inverter 214, and a system clock 220. Components in FIG. 15 with the same codes as in FIG. 4 have the same names and the same kind of functions as in FIG. 4, although their positional and connectional relationships differ, and therefore descriptions thereof are omitted.

In FIG. 15 there is a first transfer gate 211 between first flip-flop 105 and first level shifter 106, a second transfer gate 212 between second flip-flop 109 and second level shifter 108, and a third transfer gate 213 between second flip-flop 109 and first transfer gate 211 and reference power supply wiring 204, and the standby subthreshold leakage current can be improved by setting the power supply voltage of combination circuit 107 to ground potential when a power supply voltage is not being supplied to the second power supply wiring—that is, when the power supply voltage potential of the second power supply wiring is ground potential (VSS)—through application of second power supply (VDDH) potential to first transfer gate 211 and second transfer gate 212, and application of a potential that is the inverse of the second power supply (VDDH) potential to third transfer gate 213.

In this embodiment, the first power supply (VDDL) is applied to first flip-flop 105 and second flip-flop 109, enabling the immediately preceding state to be maintained even if the second power supply (VDDH) is cut off in the standby state. Therefore, when a return is made from the standby state and a power supply voltage is applied to second power supply wiring 202, it is possible to return immediately to the operating state prior to the standby state.

In FIG. 15, when a particular function block among a plurality of function blocks is set to the standby state, system clock 220 supplied to that particular function block is stopped, and then the voltage of second power supply wiring 202 supplied to that particular function block is cut off and set to ground potential. On the other hand, when a particular function block among a plurality of function blocks returns from the standby state, the power supply voltage of second power supply wiring 202 supplied to that particular function block is set to the power supply potential (the second power supply voltage value), and then system clock 220 supplied to that particular function block is applied again. By having a particular function block among a plurality of function blocks set to and restored from the standby state using the above-described procedures, design based on the concept of a dual vt/vdd technology is implemented.

Cutting power supplied to a combination circuit for which the threshold voltage is lowered during standby in this way prevents the flow of an excessively large subthreshold leakage current. Also, when a return is made from the standby state, the pre-standby state is maintained for first flip-flop 105 and second flip-flop 109 to which the first power supply (VDDL) is applied, enabling a rapid return to the operating state.

Even when functions (circuit blocks) for which processing capability differs for each function block are incorporated, design is implemented for a power supply voltage value (power supply voltage value of the second power supply) and semiconductor element threshold value (threshold voltage value) so as to improve the path delay value of a circuit block that has a critical path to the necessary path delay value derived from the operating frequency. Therefore, the power consumption and subthreshold leakage current during semiconductor integrated circuit operation, and the subthreshold leakage current in the semiconductor integrated circuit standby state, are reduced.

Furthermore, in the standby state in which power is not supplied to a function block, the standby subthreshold leakage current of a semiconductor integrated circuit is significantly reduced by cutting the second power supply (VDDH) supplied to the circuit block and setting its value to ground potential (VSS). This is possible because the threshold voltage is low while the previous state is maintained for the first flip-flop and second flip-flop of a plurality of circuit blocks that have a critical path, enabling the power supply to a combination circuit in which a larger subthreshold leakage current flows than in a semiconductor element that has a normal threshold voltage to be stopped.

Embodiment 4

Figure 16:
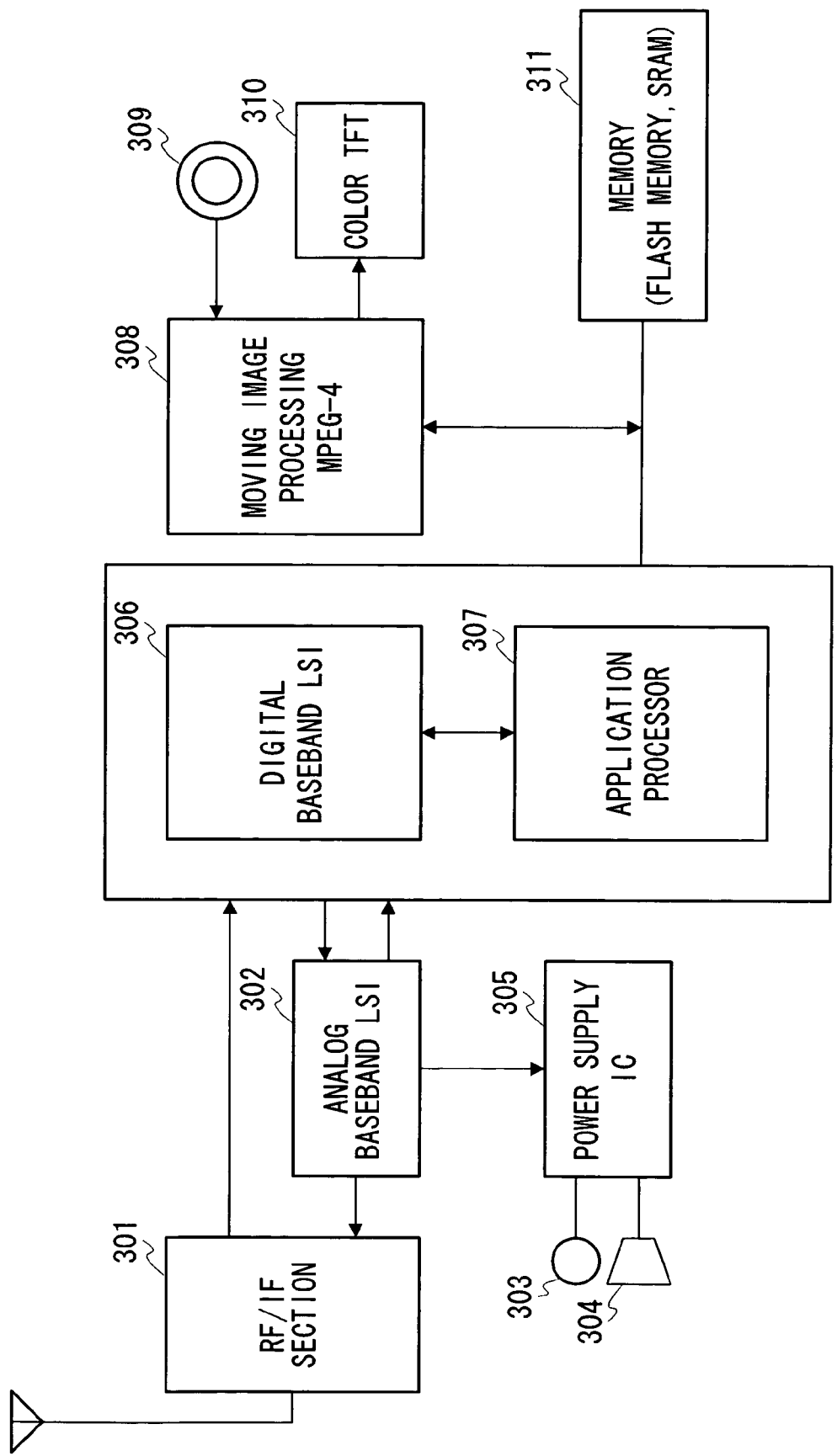
FIG. 16 is a drawing showing an example of an electronic circuit incorporating semiconductor integrated circuitry of any one of Embodiments 1 through 3 of the present invention.

FIG. 16 is a drawing showing an example of an electronic circuit incorporating semiconductor integrated circuitry of any one of Embodiments 1 through 3 of the present invention. The electronic circuitry shown in FIG. 16 is an example of the system blocks of a camera-equipped mobile phone with MPEG moving image processing functions. The electronic circuitry shown in FIG. 16 comprises an RF/IF (Radio Frequency/Intermediate Frequency) section 301, an analog baseband LSI 302, a microphone 303, a speaker 304, a power supply (Integrated Circuit) IC 305, a digital baseband LSI 306, an application processor 307, an MPEG4 moving image processing companion LSI (moving image processing MPEG-4) 308, a CMOS (Complementary Metal Oxide Semiconductor) sensor module 309, a color TFT (Thin Film Transistor) 310, and memory 311 comprising flash memory, SRAM (Static Random Access Memory), or the like.

In recent years, the degree of LSI integration has improved, and the trend is for digital baseband LSI 306, application processor 307, and MPEG4 moving image processing companion LSI 308 to be implemented as a single chip. Something like an LSI providing single-chip implementation of digital baseband LSI 306, application processor 307, and MPEG4 moving image processing companion LSI 308 contained in a camera-equipped mobile phone with MPEG moving image processing functions as shown in FIG. 16 is suitable as an electronic device incorporating low-power-consumption type semiconductor integrated circuitry shown in any one of above Embodiments 1 through 3.

Embodiment 5

In Embodiment 5, a manufacturing method of a semiconductor integrated circuit according to the present invention is described.

Figure 17:
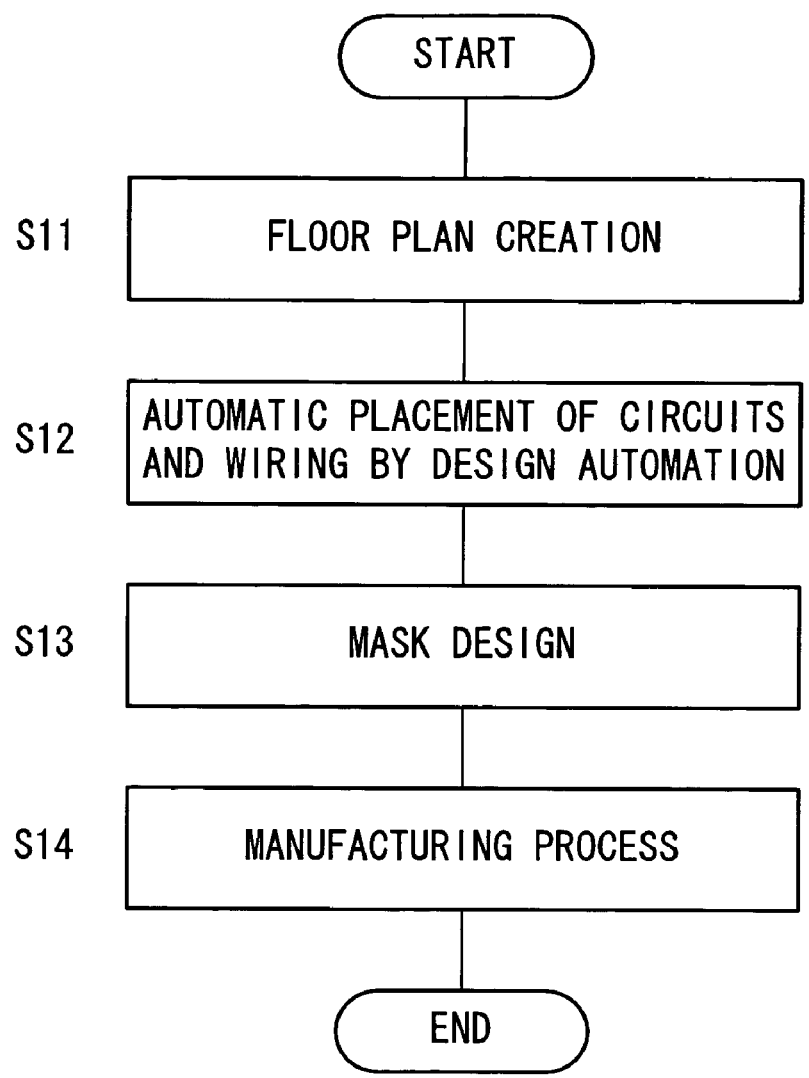
FIG. 17 is a flowchart showing an example of a semiconductor integrated circuit manufacturing method.

FIG. 17 is a flowchart showing an example of a general semiconductor integrated circuit manufacturing method. FIG. 17 shows the general manufacturing method procedure, in which the floor plan of circuit blocks to be incorporated in the semiconductor integrated circuit is created (S11), and automatic placement of circuits and wiring is performed by design automation based on the created floor plan (S12), a mask is designed based on the automatically placed circuits and wiring (S13), and a manufacturing process for manufacturing the semiconductor integrated circuit is executed using the designed mask (S14).

In manufacturing a semiconductor integrated circuit of the present invention, it is necessary in the automatic circuit and wiring placement process (S12) to perform processing that enables power appropriate to the circuit blocks (or function blocks) to be supplied.

Figure 18:
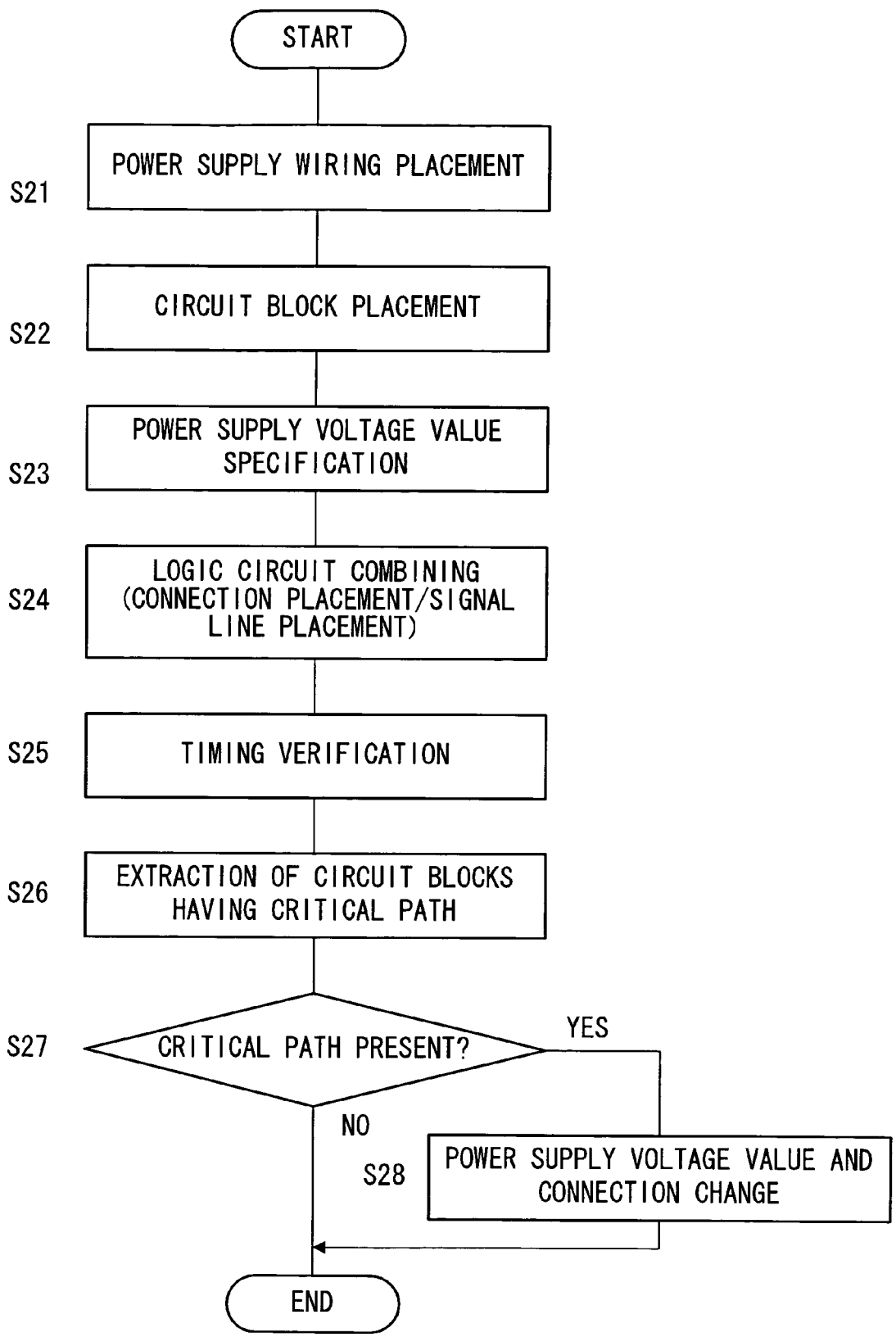
FIG. 18 is a flowchart showing an example of the process procedure for automatic placement of circuits and wiring of a semiconductor integrated circuit.
Figure 19:
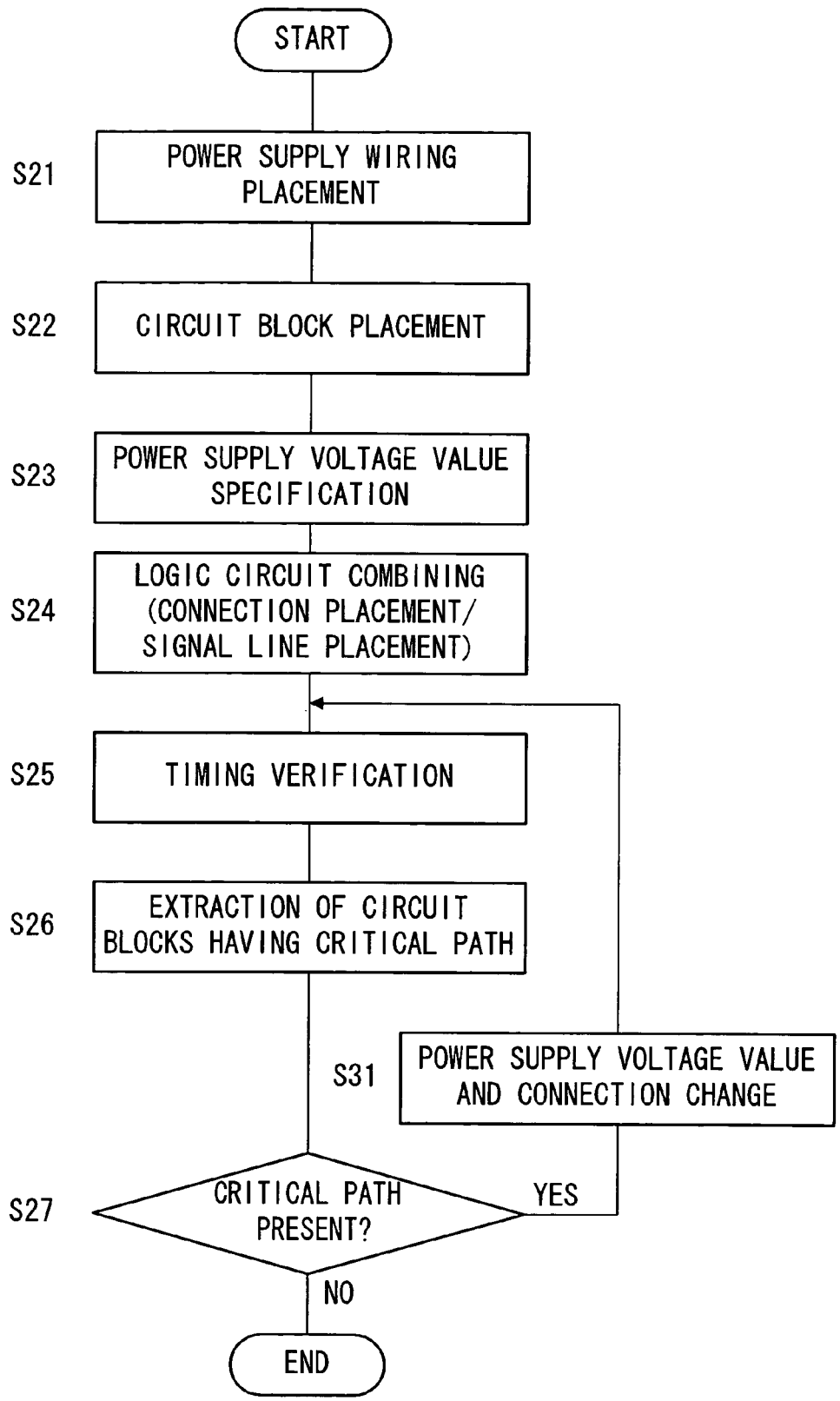
FIG. 19 is a flowchart showing another example of the process procedure for automatic placement of circuits and wiring of a semiconductor integrated circuit.
Figure 20:
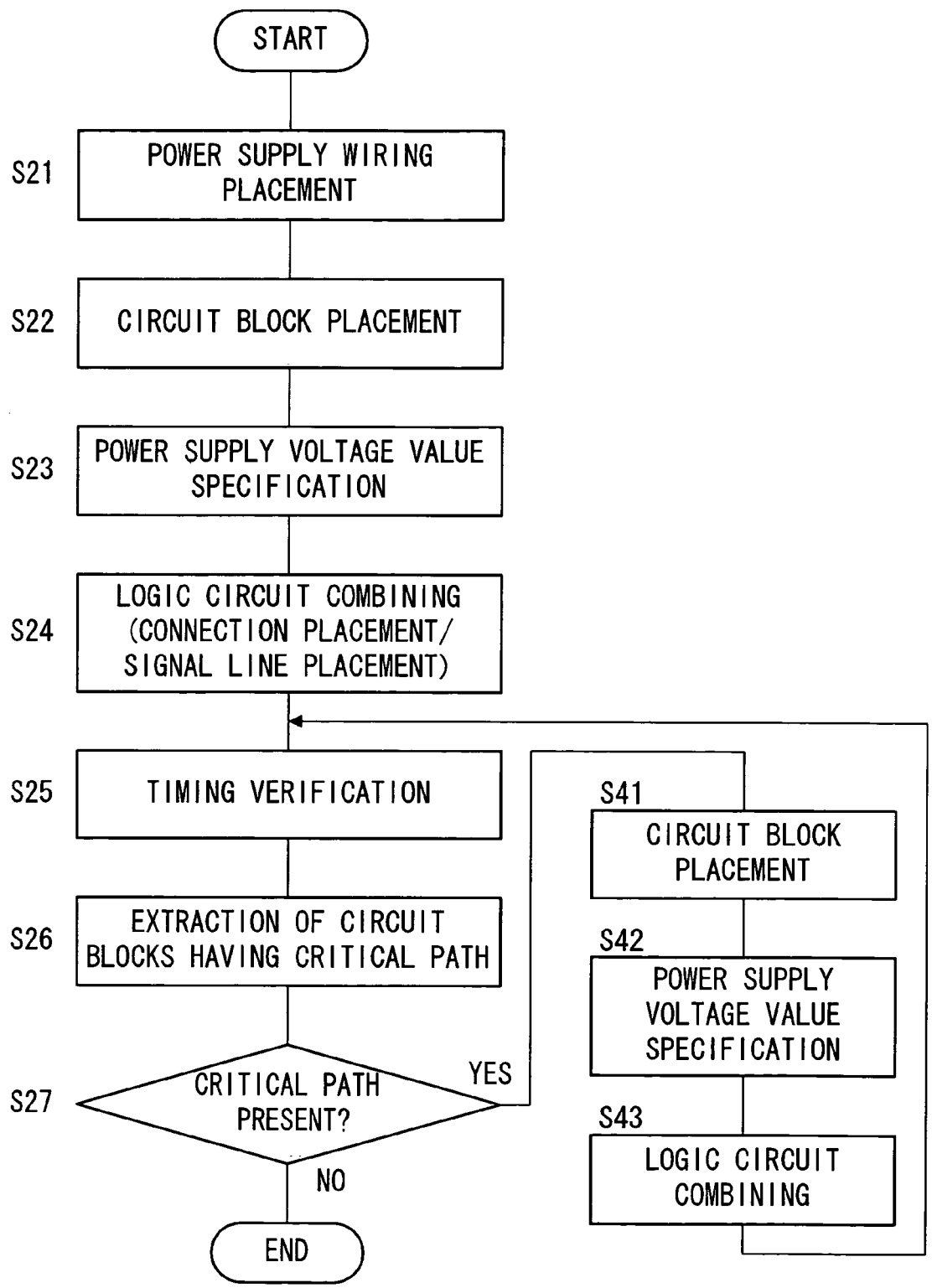
FIG. 20 is a flowchart showing still another example of the process procedure for automatic placement of circuits and wiring of a semiconductor integrated circuit.
Figure 21:
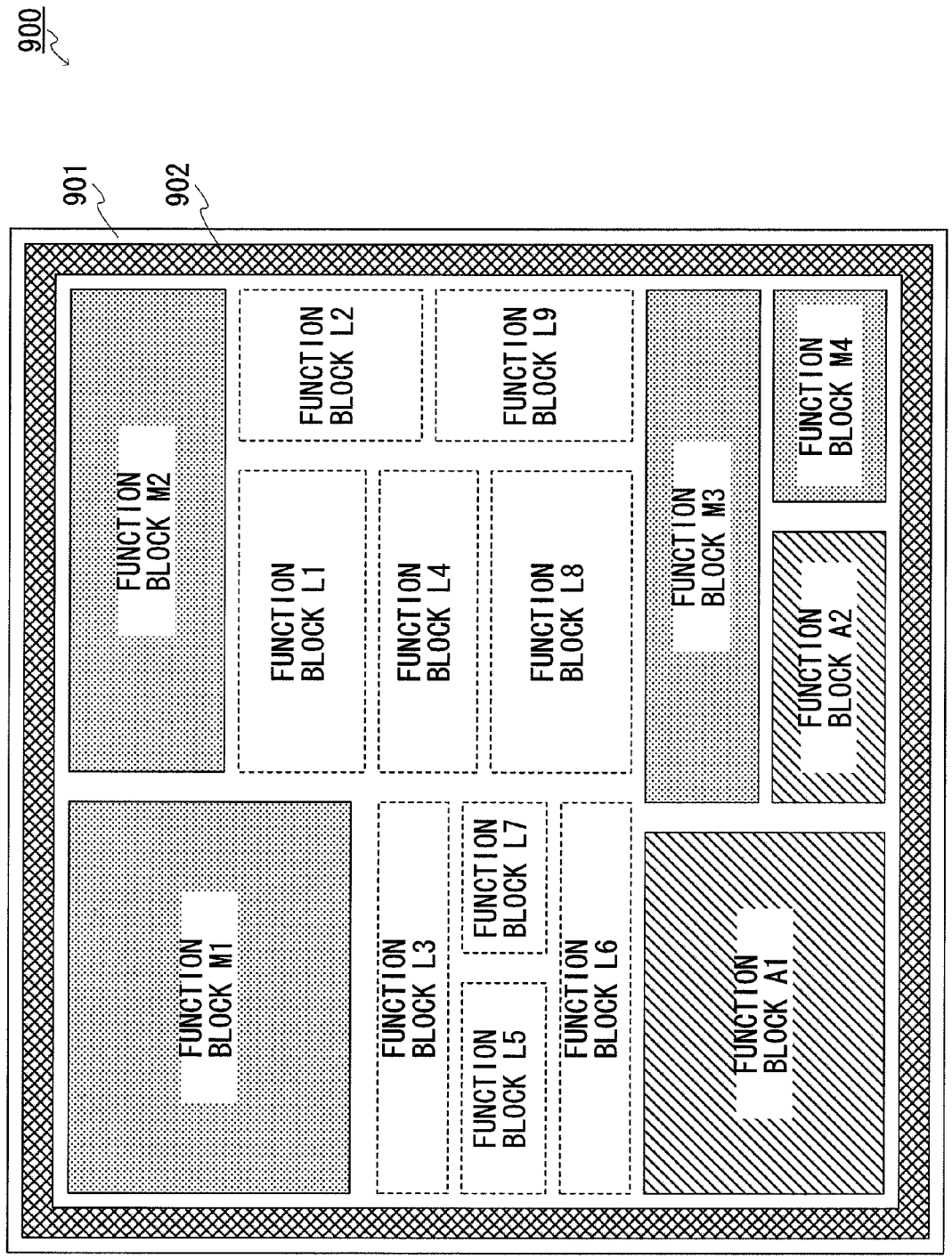
FIG. 21 is a conceptual diagram showing an example of a system LSI chip incorporating a variety of functions in a single chip.
Figure 22:
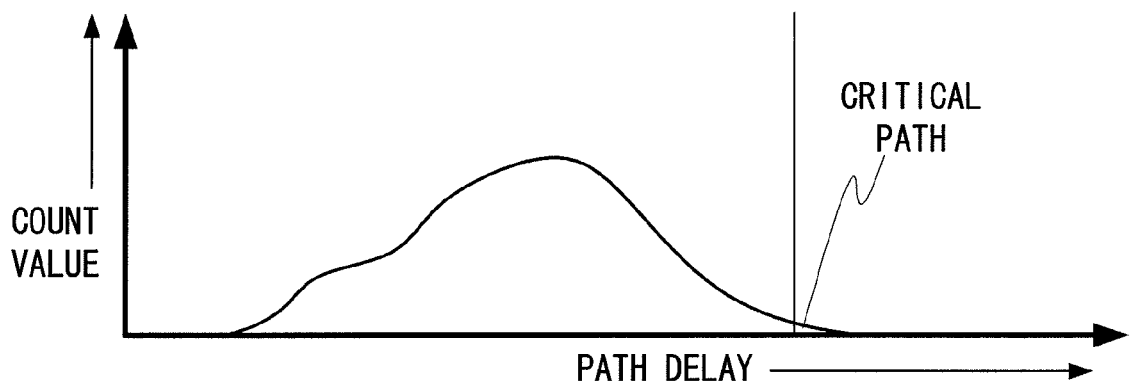
FIGS. 22A-22C comprise graphs showing examples of the relationship between path delay and count value for function blocks.
Figure 22:
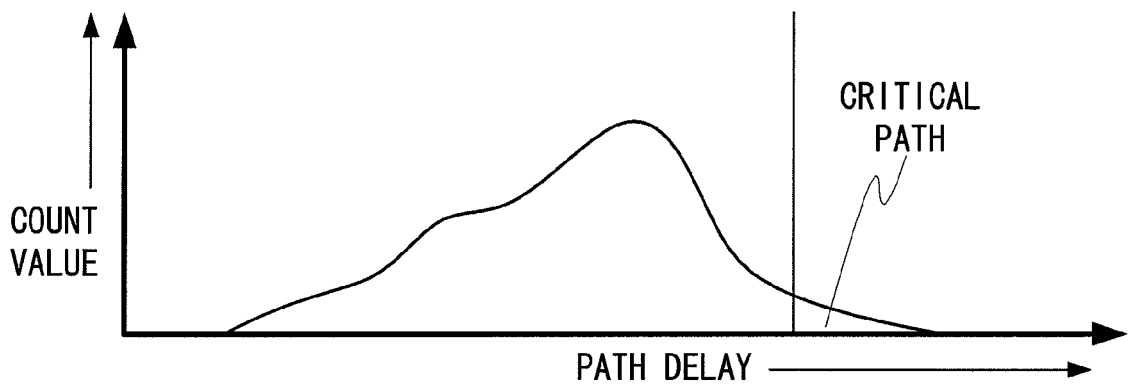
Figure 22:
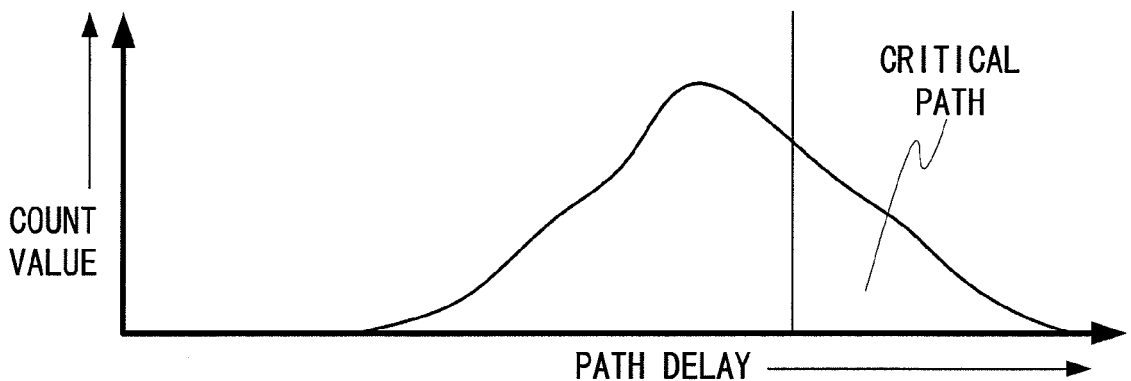

FIG. 18 through FIG. 20 are flowcharts showing examples of the process procedure for automatic placement of circuits and wiring of a semiconductor integrated circuit. In this process a computer aided design system is used, and circuit block placement, power supply wiring connection placement, signal line placement, and so forth, are executed in a semiconductor substrate circuit placement area in the memory space of the computer aided design system. The procedure is described below. In the following description, items with the same names (or codes) as in FIG. 1 or FIG. 5 are assumed to have the same kind of functions as in FIG. 1 or FIG. 5. FIG. 18 shows a simple procedure, and FIGS. 19 and 20 show procedures for supplying more suitable power supply voltages to circuit blocks.

First, power supply wiring (reference power supply wiring, first power supply wiring, second power supply wiring) is placed (S21). Next, circuit blocks are placed (S22). At this time, first circuit blocks are placed. Then the power supply voltage value of a power supply shared by a plurality of circuit blocks is specified (the first power supply, VDDL, is specified) (S23), and logic circuits are combined (S24). Here, connection placement and signal line placement are decided, and circuit blocks and first power supply wiring are connected by means of wiring sections 61b through 64b. Next, the power supply specified in S23 is supplied and timing verification is performed (S25), and circuit blocks having a critical path (second circuit blocks) are extracted (S26). If there is a second circuit block that has a critical path (YES in S27), the power supply voltage value supplied to that second circuit block (here, the second power supply, VDDH, is specified) and the connection between the power supply wiring and that second circuit block are changed (S28), and processing ends. To describe a change of the connection between power supply wiring and circuit blocks (S28) using FIG. 1, second circuit blocks 51 through 54 are connected to second power supply wiring 26 by means of wiring sections 61a through 64a.

By means of such a procedure, it is possible for power supply wiring that supplies a power supply voltage appropriate to the processing capability of a circuit block that has a critical path to be connected to that circuit block. In particular, FIG. 18 illustrates a case in which two power supplies, a first power supply and second power supply, are used.

Next, the procedure shown in FIG. 19 will be described. Processes with the same step numbers as in FIG. 18 involve the same operations, the difference being that in the operations after critical path extraction the power supply voltage of the second power supply is changed in multiple stages until there is no longer a critical path. Operations that differ from those in FIG. 18 are described below.

If there is a critical path (YES in S27), the power supply voltage value supplied to a second circuit block that has that critical path (the second power supply) and the connection between the power supply wiring and that second circuit block are changed (S31). Then operations from timing verification (S25) are repeated until there is no longer a critical path. When determining whether or not there is a critical path, margins and so forth are also considered. Also, for the second power supply changed in S31, a higher power supply voltage value than previously is selected (here, VDDHn, where n is the number of power supplies that can be supplied). To describe the result of the operation in S31 in concrete terms using FIG. 5, second circuit blocks 51 through 54 are connected to second power supply wiring 26b by means of wiring areas 61a through 64a. Second power supply wiring 26b is connected to one of second main power supply wirings 23b, 23c, or 23d that supplies the power supply voltage value selected in S31. In this way, second power supplies with a plurality of power supply voltage values are supplied to second circuit blocks by repeating the process of making the second power supply voltage value higher than the previous voltage value until there is no longer a critical path.

It is thus possible for power supplies having a plurality of power supply voltage values to be supplied to circuit blocks in a semiconductor integrated circuit, and circuit blocks that have a critical path are connected to power supply wiring having different power supply voltage values according to the processing capability. In particular, FIG. 19 illustrates a case in which a second power supply is changed in multiple stages.

Next, the procedure shown in FIG. 20 will be described. Processes with the same step numbers as in FIG. 18 involve the same operations, the difference being that the threshold voltage is changed in operations after critical path extraction. Operations that differ from those in FIG. 18 are described below.

If there is a critical path (YES in S27), processing steps S41 through S43 are executed on a second circuit block having a critical path. First, the threshold voltage (threshold value) to be applied is selected, and the second circuit block is placed using a selected logic circuit library (S41). Next, the power supply voltage (second power supply) to be applied is specified (S42), and logic circuits are combined again (S43). For the power supply voltage specified in S42, a higher power supply voltage value than previously is selected (VDDHn, where n is the number of power supplies that can be supplied). Threshold voltage and power supply voltage value selection is implemented based on the dual vt/vdd technology concept.

Then timing verification is performed using the recombined circuitry (S25), the procedure proceeds to critical path extraction, and this is repeated until there is no longer a critical path. Operations in S41 through S43 are similar to those in S22 through S24, except that processing is executed only for circuit blocks selected in S27. Details of connection of second circuit blocks 51 through 54 to second power supply wiring 26b, connection of second power supply wiring 26b to second main power supply wiring 23b, 23c, or 23d, and supply of a second power supply, are as described with reference to FIG. 19.

It is thus possible for power supplies having a plurality of power supply voltage values to be supplied to circuit blocks in a semiconductor integrated circuit, and circuit blocks that have a critical path are connected to power supply wiring having different power supply voltage values according to the processing capability. In particular, FIG. 20 illustrates a case in which it is possible to select an optimal power supply for a circuit block based on the power supply voltage value and threshold voltage.

Such design procedures enable lower power consumption to be achieved for application specific semiconductor integrated circuits such as system LSIs that incorporate a variety of functions.

Also, by having a process whereby design is implemented for a power supply voltage value (second power supply, VDDH) and threshold voltage value so as to improve the path delay value of a circuit block that has a critical path to the necessary path delay value derived from the operating frequency, the power consumption and subthreshold leakage current during semiconductor integrated circuit operation, and the subthreshold leakage current in the semiconductor integrated circuit standby state, are reduced.

As described above, according to the present invention it is possible to achieve a reduction in the power consumption of a semiconductor integrated circuit that incorporates a variety of functions.

That is to say, a semiconductor integrated circuit of the present invention has a first circuit block that does not include a critical path; a second circuit block that includes the critical path; first power supply wiring that supplies a first power supply to the first circuit block; and second power supply wiring that supplies a second power supply of higher voltage than the first power supply to the second circuit block.

According to this configuration, it is possible to achieve a reduction in the power consumption of a semiconductor integrated circuit that incorporates a variety of functions.

The first circuit block has at least one of a first semiconductor element and a first logic circuit that do not form a critical path; the second circuit block has at least one of a second semiconductor element and a second logic circuit that form the critical path; and the first power supply wiring is connected to either the first semiconductor element or the first logic circuit, and the second power supply wiring is connected to either the second semiconductor element or the second logic circuit.

According to this configuration, it is possible to select power supply wiring for supply according to whether a semiconductor element or logic circuit forms or does not form a critical path.

The semiconductor integrated circuit further has a third circuit block that includes the critical path; and third power supply wiring that supplies a third power supply of higher voltage than the second power supply to the third circuit block.

According to this configuration, the voltage value of a supplied power supply can be changed appropriately according to the processing capability of a circuit block.

The first circuit block has at least one of the first semiconductor element and the first logic circuit; and in the second circuit block the threshold voltage value of either the second semiconductor element or the second logic circuit is set lower than the threshold voltage of either the first semiconductor element or the first logic circuit.

According to this configuration, it is possible to supply a power supply that has a power supply voltage value suited to the processing capability of each of a plurality of circuit blocks that include a critical path.

A semiconductor integrated circuit of the present invention has basic cell rows in which a plurality of circuit blocks are placed, arranged in a plurality in a first direction; a wiring placement area formed between adjacent basic cell rows in the first direction; reference power supply wiring that extends in a second direction in the wiring placement area and supplies a reference power supply to the circuit blocks; first power supply wiring that extends in the second direction in the wiring placement area and supplies a first power supply of higher voltage than the reference power supply to the circuit blocks; and second power supply wiring that extends in the second direction in the wiring placement area and supplies a second power supply of higher voltage than the first power supply to the circuit blocks.

According to this configuration, a plurality of power supply wirings are extended close to a cell row, enabling an appropriate power supply to be supplied to the respective elements included in a cell row, and making it possible to achieve lower power consumption.

In the circuit blocks placed in the basic cell row there are provided a first circuit block that does not include a critical path and a second circuit block that includes a critical path; and the reference power supply wiring and the first power supply wiring are connected to the first circuit block, and the reference power supply wiring and the second power supply wiring are connected to the second circuit block.

According to this configuration, power supplies can be supplied that have voltage values adapted to the respective circuit blocks.

The semiconductor integrated circuit has a level shifter that performs input signal level or output signal level alignment between the first circuit block and the second circuit block.

According to this configuration, an input signal level and output signal level are adjusted by having power supplies with different voltage values supplied by a level shifter.

The semiconductor integrated circuit further has third power supply wiring that extends in the second direction in the wiring placement area and supplies a third power supply of higher voltage than the second power supply to the circuit blocks.

According to this configuration, the voltage value of a supplied power supply can be changed appropriately according to the processing capability of a circuit block.

A semiconductor integrated circuit manufacturing method of the present invention has a step of placing first power supply wiring that supplies a first power supply and second power supply wiring that supplies a second power supply of higher voltage than the first power supply; a step of placing a plurality of circuit blocks; a step of connecting the plurality of circuit blocks to first power supply wiring; a step of extracting a circuit block that includes a critical path among the plurality of circuit blocks; and a step of replacing the connection of the circuit block that includes the critical path to first power supply wiring with connection of the circuit block that includes the critical path to second power supply wiring.

According to this configuration, lower power consumption can be achieved by selecting appropriate power supply wiring for supply to a circuit block that includes a critical path.

The above-described semiconductor integrated circuit manufacturing method further has a step of, after the step of replacement with connection of the circuit block that includes the critical path to the second power supply wiring, performing a step of extracting the critical path, and making the second power supply voltage value higher than the previous voltage value until there is no longer a critical path.

According to this configuration, it is possible to select power supply wiring with an appropriate voltage value for each circuit block that includes a critical path, and to suppress the supply of excessive power.

The step of placing a plurality of circuit blocks further has a step of placing a plurality of circuit blocks that have a first threshold value, being a step of replacing a first threshold value of a circuit block that includes the critical path with a second threshold value lower than the first threshold value after the step of extracting a circuit block that includes the critical path.

According to this configuration, lower power consumption can be achieved by changing the threshold value of a circuit block.

Therefore, a semiconductor integrated circuit and semiconductor integrated circuit manufacturing method according to the present invention is effective in reducing the power consumption of a large-scale semiconductor integrated circuit (system LSI) that incorporates a variety of functions in a single chip.

The present invention is not limited to the above-described embodiments, and various variations and modifications may be possible without departing from the scope of the present invention.

This application is based on Japanese Patent Application No. 2004-241466 filed on Aug. 20, 2004, the entire content of which is expressly incorporated by reference herein.

What is claimed is:

1. A semiconductor integrated circuit, comprising:
a first circuit block that does not include a critical path; and
a second circuit block that includes the critical path,
wherein a power supply voltage value supplied to the second circuit block for an operation is higher than a power supply voltage value supplied to the first circuit block for the operation;
wherein the second circuit block comprises a first flip-flop, a level shifter, a combination circuit and a second flip-flop, which are connected in series; and
wherein a threshold voltage of the combination circuit of the second circuit block is lower than threshold voltages of combination circuits other than the combination circuit of the second circuit block, and, in response to a standby request for the second circuit block, a supply of a power supply voltage supplied to the combination circuit of the second circuit block is cut off.

2. The semiconductor integrated circuit according to claim 1,
wherein the second circuit block comprises a plurality of circuit blocks with different power supply voltage values and different threshold voltages of combination circuits.

3. The semiconductor integrated circuit according to claim 1,
wherein, when the second circuit block is set to a standby state, a system clock supplied to the first flip-flop and the second flip-flop is stopped, and the supply of the power supply voltage supplied to the combination circuit of the second circuit block is cut off; and
wherein, when the second circuit block is restored from the standby state, a power supply voltage is supplied to the combination circuit of the second circuit block, and then the system clock is supplied to the first flip-flop and the second flip-flop.

* * * * *